United States Patent [19]

Miyashita et al.

[11] Patent Number: 5,829,969
[45] Date of Patent: Nov. 3, 1998

[54] VERTICAL HEAT TREATING APPARATUS

[75] Inventors: Masahiro Miyashita, Yokohama; Kenichi Yamaga; Katsuhiko Mihara, both of Hachioji, all of Japan

[73] Assignee: Tokyo Electron Ltd., Tokyo-to, Japan

[21] Appl. No.: 835,820

[22] Filed: Apr. 16, 1997

[30] Foreign Application Priority Data

Apr. 19, 1996 [JP] Japan .................................. 8-122596
Sep. 20, 1996 [JP] Japan .................................. 8-271736

[51] Int. Cl.⁶ ...................................................... F27D 5/00
[52] U.S. Cl. ............................ 432/253; 432/5; 432/241; 432/258
[58] Field of Search ................................. 432/241, 5, 6, 432/152, 253, 11, 258

[56] References Cited

U.S. PATENT DOCUMENTS 5,221,201  6/1993  Yamaga et al. ............................ 432/11
5,277,579  1/1994  Takanabe ................................. 432/241

FOREIGN PATENT DOCUMENTS 1-253232  10/1989  Japan .
2-219220   8/1990  Japan .
3-248418  11/1991  Japan .
3-261161  11/1991  Japan .
4-99315    3/1992  Japan .

*Primary Examiner*—Philip H. Leung
*Assistant Examiner*—Jiping Lu
*Attorney, Agent, or Firm*—Beveridge, DeGrandi, Weilacher & Young, L.L.P.

[57] ABSTRACT

A vertical heat treating apparatus includes a first boat elevator for carrying a first wafer boat between a wafer transfer region and a predetermined position in a heat treating furnace, and a second boat elevator for carrying a second wafer boat between the wafer transfer region and the predetermined position in the heat treating furnace. With this construction, it is possible to eliminate the problems of causing the position shift of the wafer boat, so that and it is possible to prevent the wafer boat from overturning. The apparatus also has cutouts formed in the lower end portion of the wafer boat, and guide members formed on the upper surface of a wafer transfer stage so as to be engageable with the cutouts. With this construction, if the positioning is forcibly carried out when the wafer boat is loaded on the wafer transfer stage, it is possible to correct the position shift to prevent the shift from accumulating, so that it is possible to prevent the wafer boat from overturning.

10 Claims, 18 Drawing Sheets

VERTICAL HEAT TREATING APPARATUS

BACKGROUND OF THE INVENTION

1. Field of the Invention

The present invention relates generally to a vertical heat treating apparatus. More specifically, the invention relates to a vertical heat treating apparatus for carrying out the heat treatment of a substrate such as a semiconductor wafer.

2. Description of the Related Art

As one of important steps for manufacturing a semiconductor wafer, there is a heat treating step, such as formation of an oxide film, diffusion of a dopant, annealing and CVD, which is carried out in, e.g., a vertical heat treating apparatus. In such a vertical heat treating apparatus, a plurality of wafers are loaded on a wafer boat below a reaction tube, and then, the wafers are carried in the reaction tube by lifting a boat elevator. Then, a predetermined heat treatment is carried out by heating the interior of the reaction tube to a predetermined temperature while introducing a treating gas into the reaction tube.

In one of methods for improving the throughput of the whole heat treating step, two wafer boats are prepared, and wafers W are transferred to one of the wafer boats while the other wafer boat is loaded into a reaction tube to carry out the heat treatment. Specifically, conventional heat treating steps are shown in FIGS. 1A through 1C. First, in a step shown in FIG. 1A, a first wafer boat 11 having wafers W loaded thereon is transferred to a location above a heat insulating cover 13 of a boat elevator 12, and the boat elevator 12 is raised to carry the first wafer boat 11 in a heat treating furnace 14 to carry out the heat treatment. On the other hand, a second wafer boat 15 is loaded on a wafer transfer stage 16, and the wafers W are transferred to the second wafer boat 15 by means of a wafer transfer arm 17. The loading of the wafer boat 11 on the heat insulating cover 13 is carried out by engaging an annular projecting portion 11a formed on the lower end portion of the wafer boat 11, with a recessed portion 13a formed in the upper face of the heat insulating cover 13, as shown in FIG. 2.

Subsequently, in a step shown in FIG. 1B, the boat elevator 12 is moved downwards to carry the first wafer boat 11 out of the heat treating furnace 14 after the heat treatment is completed. Then, after the first wafer boat 11 is moved to an intermediate stage 18 by means of a boat transfer arm (not shown), the second wafer boat 15 is moved to a location above the heat insulating cover 13 of the boat elevator 12 by means of the boat transfer arm. Then, in a step shown in FIG. 1C, the second wafer boat 15 is carried in the heat treating furnace 14 to carry out the heat treatment. On the other hand, the first wafer boat 11 is moved to the wafer transfer stage 16 by means of the boat transfer arm to carry out the transfer of the wafers W herein.

In the aforementioned method, the first and second wafer boats 11 and 15 are sequentially moved from the wafer transfer stage 16 to the intermediate stage 18 via the boat elevator 12. However, the wafer boat 11 (or 15) is merely loaded on the stage 16 or 18, and the accuracy of the boat transfer arm is limited by its costs and so forth, so that it is not possible to prevent the position shift of the wafer boat 11 (or 15) from slightly occurring when it is transferred.

When the transfer is repeated, the position shifts of the wafer boat 11 are gradually accumulated, and finally, the lower end of the wafer boat 11 can not engage the recessed portion of the heat insulating cover 13 of the boat elevator 12, so that the waver boat 11 may accidentally fall. If such an accident occurs, the wafer boat 11 is damaged to inflict a great loss since the wafer boat is manufactured by accurately processing quartz or the like and it is very expensive.

In order to prevent such an accident from occurring, there has been studied a method for decreasing the position shift by inserting a guide, which is provided on a heat insulating cover, into a cutout, which is formed in the lower end portion of a wafer boat so as to be engageable with the guide, when the wafer boat is loaded on the heat insulating cover. However, in such a method, it is not possible to surely align the wafer boat with the heat insulating cover and it is not sufficient to prevent the position shift from accumulating, since quartz, Sic and so forth serving as the materials of the wafer boat and the heat insulating cover are difficult to slide.

On the other hand, as a heat treating apparatus for batchwisely carrying out a heat treatment, such as the film forming treatment of a semiconductor wafer (which will be hereinafter referred to as a "wafer") or the formation of an oxide film, there is a vertical heat treating apparatus shown in FIG. 3. In the drawing, the reference number 20 denotes an input/output port of an open-type wafer cassette 21 (which will be hereinafter referred to as a "cassette 21"). Behind this, a stocker 22 and an intermediate stage 23 are provided, via a transfer passage of a cassette arm 22a, on the upper and lower sides, respectively. Behind the intermediate stage 23, a wafer boat 24 is provided via a wafer transfer means 23a. Above the wafer boat 24, a heat treating furnace 25 is provided. When a boat elevator 24a is moved upwards, the wafer boat 24 is carried in the heat treating furnace 25.

As shown in FIG. 4, the uppermost and lowermost end regions of the wafer boat 24 are not used to serve as dummy regions, and the other regions than the uppermost and lowermost end regions are used as treating regions, on which treated wafers W1 (which will be hereinafter referred to as "wafers W1") are loaded. Because the temperature differences from a set temperature on the upper and lower sides of the wafer boat 24 in the heat treating furnace 25 are too great to carry out a uniform heat treatment due to the structure of the heat treating furnace 25. Dummy wafers W2 are always loaded in the dummy regions. When the number of the wafers W1 transferred from the cassette 21 to the wafer boat 24 is less than the number of the wafers in the treating regions, a wafer absent portion wherein no wafer is loaded occurs in any one of the treating regions to prevent a treating gas from uniformly flowing therethrough. In order to fill the wafer absent portion, the dummy wafers W2 are loaded.

In the aforementioned vertical heat treating apparatus, the wafers W1 are housed in a wafer cassette 21a for treatment (which will be hereinafter referred to as a "treating cassette 21a"), and the dummy wafers W2 are housed in a cassette 21b for dummy wafers (which will be hereinafter referred to as a "dummy cassette 21b"). The treating cassette 21a and the dummy cassette 21b are housed in the stocker 22. The treating cassette 21a and the dummy cassette 21b are carried from the stocker 22 to the intermediate stage 23 by means of the cassette arm 22a. The number of the wafers W1 in each of the treating cassettes 21a is counted by means of a wafer counter (not shown) in the input/output port 20. In accordance with the counted value, the wafers W1 are transferred after the dummy wafers W2 are transferred to predetermined positions on the wafer boat 24 using the wafer transfer means 23a.

In recent years, the device size has been decreased with the improvement of the fine patterning, so that it has been more important to restrain natural oxide layer and particles from occurring. For that reason, there are plans in that a transfer chamber formed below the heat treating furnace 25 is divided and that the cassette itself is formed as a closed-type cassette having a lid to improve the cleanliness in the cassette. FIG. 5 shows an example of heat treating apparatus for realizing the aforementioned plans. In the apparatus shown in FIG. 5, a wall portion 27 of a transfer chamber 26 is formed with a delivery port 27a having a lid. A closed-type cassette 28 (which will be hereinafter referred to as a "cassette 28") carried from a stocker 22 is loaded and the lid is removed, so that the cassette 28 is in communication with the transfer chamber 26 via the delivery port 27a for transferring wafers from the cassette 28 to a wafer boat 24 by means of a transfer arm 29.

However, in such a closed-type cassette 28, the number of wafers in the cassette 28 can not be counted unless the lid is open. Therefore, after the cassette 28 is mounted in the delivery port 27a, the number of wafers is counted by means of, e.g., a wafer counter provided near the delivery port 27a. Then, in a case where the number of the counted wafers W1 is less than the number of wafers in a treating region (a region for holding the treated wafers) of the wafer boat 24, the dummy wafers W2 must be supplied for filling the insufficiency of wafers as mentioned above.

In a case where the wafers W1 are transferred to the treating region of the wafer boat 24 in the order from the uppermost wafer, after the wafers W1 in the cassette 28 are transferred, the dummy wafers W2 corresponding to the insufficiency may be transferred to the lower stage thereof. However, it is not usually performed to transfer the wafers W1 in the order from the uppermost wafer.

For example, as shown in FIG. 4, the treating region of the wafer boat 24 may be divided into three blocks B (B1, B2, B3) for every wafers of one cassette (three blocks are merely used as an example), and one of the cassettes 28 may be assigned to each of the blocks B to be controlled, e.g., in order to recognize which block treated the cassette 28 including a monitor wafer by analyzing the monitor wafer. In addition, when the number of the wafers WI is small, the wafers WI may be arranged in a better quality region, e.g., a region near the center of the treating region.

In such an arrangement, the dummy wafers W2 are arranged above the wafers W1. In this case, in order to reduce the contamination due to particles, it is required to transfer the dummy wafers W2 prior to the transfer of the wafers W1, and to prevent the dummy wafers W2 from being transferred from the upper side of the wafers W1 after transferring the wafers W1.

Therefore, in this case, a treating wafer cassette 28a (which will be hereinafter referred to as a "treating cassette 28a") is first mounted in the delivery port 27a, and the number of the wafers W1 is counted. Then, the treating cassette 28a is replaced by a dummy wafer cassette 28b (which will be hereinafter referred to as a "dummy cassette 28b"), and the dummy wafers W2 are transferred to the wafer boat 24. Thereafter, the dummy cassette 28b is replaced by the treating cassette 28a, and the wafers W1 are transferred to the wafer boat 24.

Whenever the treating cassette 28a is replaced by the dummy cassette 28b, the lids of the cassettes 28a and 28b and the delivery port 27a must be open and closed. In addition, since operations, such as the transfer of the cassettes 28a and 28b between the stocker 22 and the delivery port 27a, must be carried out, there are problems in that the sequence is complicated and the operations take a lot of time.

SUMMARY OF THE INVENTION

It is therefore an object of the present invention to eliminate the aforementioned problems and to provide a vertical heat treating apparatus which can prevent first and second holders from overturning when the heat treatment of an object is carried out using the first and second holders.

It is another object of the present invention to provide a vertical heat treating apparatus which can easily and quickly transfer dummy substrates to be treated to a holder and which can increase the number of substrates to be treated, which can be housed in a cassette housing portion.

In order to accomplish the aforementioned and other objects, according to one aspect of the present invention, there is provided a vertical heat treating apparatus which comprises: a vertical heat treating furnace for allowing the carrying in and out of the furnace from a bottom thereof; first and second holders for holding a plurality of objects to be treated, the first and second holders being carried in and out of the vertical heat treating furnace; a first holder carrying means for loading thereon the first holder to move between a position in the vertical heat treating furnace and a transfer region remote from the position in the vertical heat treating furnace, to carry the first holder; a second holder carrying means for loading thereon the second holder to move between a position in the vertical heat treating furnace and a transfer region remote from the position in the vertical heat treating furnace, to carry the second holder; and a treated-object transfer means for delivering objects to be treated, to the first and second holders in the transfer region, wherein the first holder carrying means and the second holder carrying means alternately carries the first and second holders in and out of the vertical heat treating furnace to carry out the heat treatment of the objects.

The vertical heat treating apparatus may further comprise: a transfer chamber being communicated with the vertical heat treating furnace and receiving therein the first and second holders, the first and second holder carrying means, and the treated-object transfer means; a third holder, provided in the transfer region in the transfer chamber, for holding dummy objects to be treated; a delivery port, formed in a wall of the transfer chamber so as to face the transfer region, for carrying the objects to be treated, into the transfer chamber from the outside thereof; a closed-type treated-object cassette having a cassette body for housing therein a plurality of objects to be treated, and a lid for opening and closing an opening of the cassette body, the interior of the cassette being communicated with the interior of the transfer chamber by arranging the opening, which is closed by the lid of the cassette body, in the delivery port and by removing the lid, so as to allow the carrying of the objects to be treated into said transfer chamber; and a treated-object counter for counting, in the delivery port, the number of objects to be treated, housed in the closed-type treated-object cassette after the lid of the closed-type treated-object cassette is removed, wherein the transfer means transfers the objects to be treated, between the closed-type treated-object cassette mounted in the delivery port and the first and second holders, and also transfers the dummy objects to be treated, from the third holder to the first or second holder on the basis of the counted results of the treated-object counter.

The vertical heat treating apparatus may further comprise a cassette housing portion, provided in a region outside of the transfer chamber, for housing therein the treated-object cassette housing therein the objects which have not been treated, and the treated-object cassette housing therein the object which have been treated.

Alternatively, the vertical heat treating apparatus may further comprise: a transfer chamber being communicated with the vertical heat treating furnace and receiving therein the first and second holders, the first and second holder carrying means, and the treated-object transfer means; a third holder, provided in the transfer region in the transfer chamber, for holding dummy objects to be treated; a treated-object cassette for housing therein a plurality of treating objects to be treated; a treated-object counter for counting the number of the objects in the treated-object cassette; a delivery loading portion, which is provided in the transfer region in the transfer chamber and on which the treated-object cassette is loaded; and a cassette housing portion, provided in a region outside of the transfer chamber, for housing therein the treated-object cassette housing therein the objects which have not been treated, and the treated-object cassette housing therein the objects which have been treated, wherein the transfer means transfers the objects to be treated, between the treated-object cassette mounted on the delivery loading portion and the first and second holders, the transfer means also transferring the dummy objects from the third holder to the first or second holder on the basis of the counted results of the treated-object counter.

According to another aspect of the present invention, there is provided a vertical heat treating apparatus which comprises: a vertical heat treating furnace for allowing the carrying in and out of the furnace from a bottom thereof; a holder for holding a plurality of objects to be treated, the holder being carried in and out of the vertical heat treating furnace; a holder lifting means for lifting the holder between the interior of the vertical heat treating furnace and a lower position below the vertical heat treating furnace; a holder loading portion, provided in a transfer region remote from the lower position below said furnace, for loading thereon the holder; a transfer means for moving the holder between the holder lifting means and the holder loading means; a treated-object transfer means for delivering the objects to be treated, to the holder loaded on the holder loading portion; and a positioning mechanism for forcing to position the holder loaded on the holder loading portion.

The positioning mechanism may includes: an engaging portion provided in a lower end portion of the holder; a guide member, which is provided on the holder loading portion and which engages the engaging portion; and a pushing portion for pushing the guide member up toward the engaging portion, wherein when the holder is loaded on the holder loading portion, the guide member is pushed up by means of the pushing mechanism to forcibly engage the engaging portion of the holder to position the holder.

The vertical heat treating apparatus may further comprise a gas supply means for supplying a gas to a loading face of the holder loading portion.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to specific embodiments, but are for explanation and understanding only.

In the drawings.

DESCRIPTION OF THE PREFERRED EMBODIMENTS

Referring now to the accompanying drawings, the preferred embodiments of the present invention will be described in detail below.

Figure 1A:
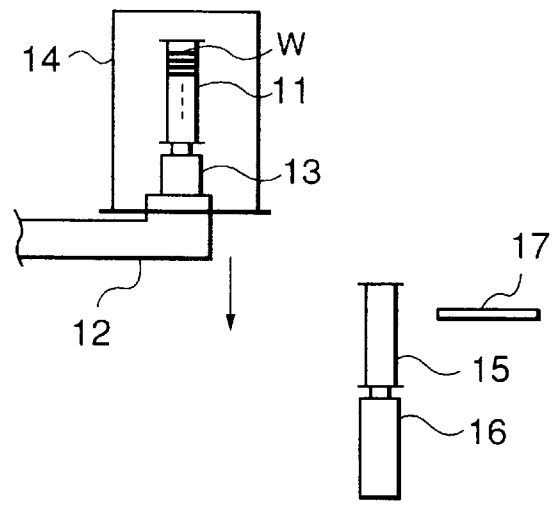
FIGS. 1A through 1C are views explaining the operation of a conventional vertical heat treating apparatus.
Figure 1B:
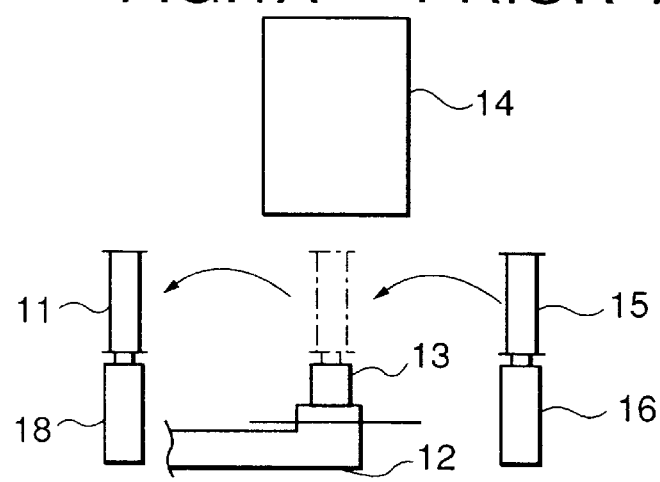
Figure 1C:
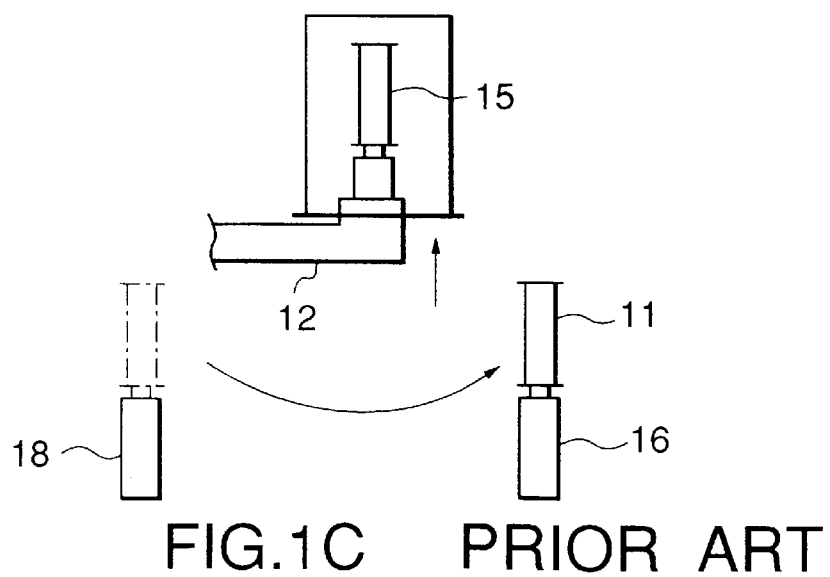
Figure 2:
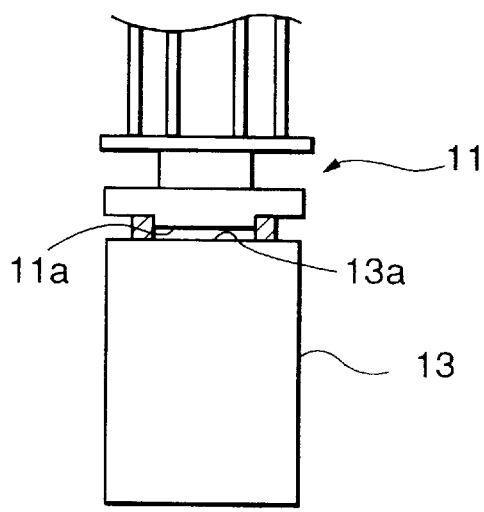
FIG. 2 is an explanatory view illustrating the state that a wafer boat is loaded on a heat insulating cover in the conventional vertical heat treating apparatus.
Figure 3:
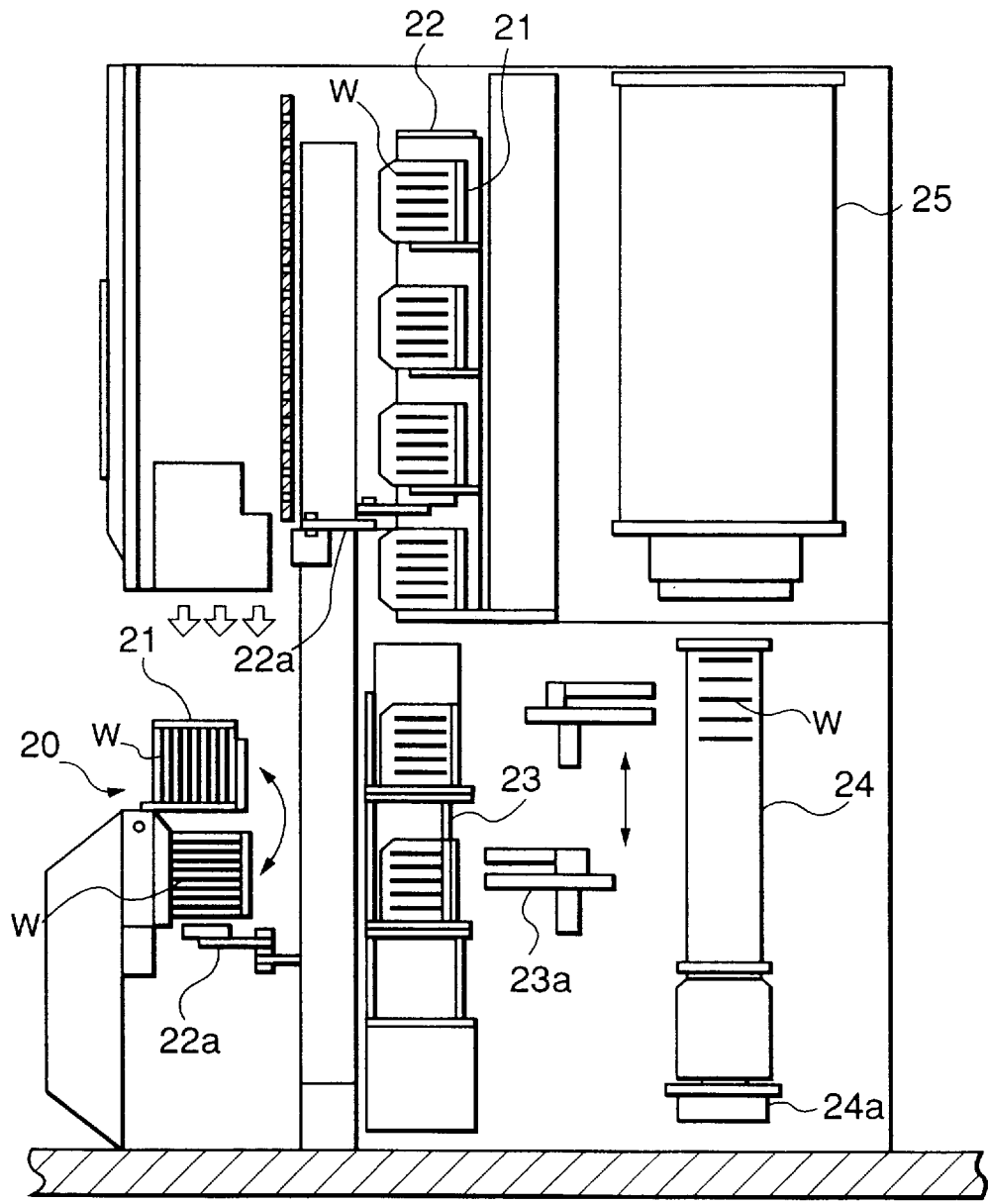
FIG. 3 is a side elevation of the conventional vertical heat treating apparatus.
Figure 4:
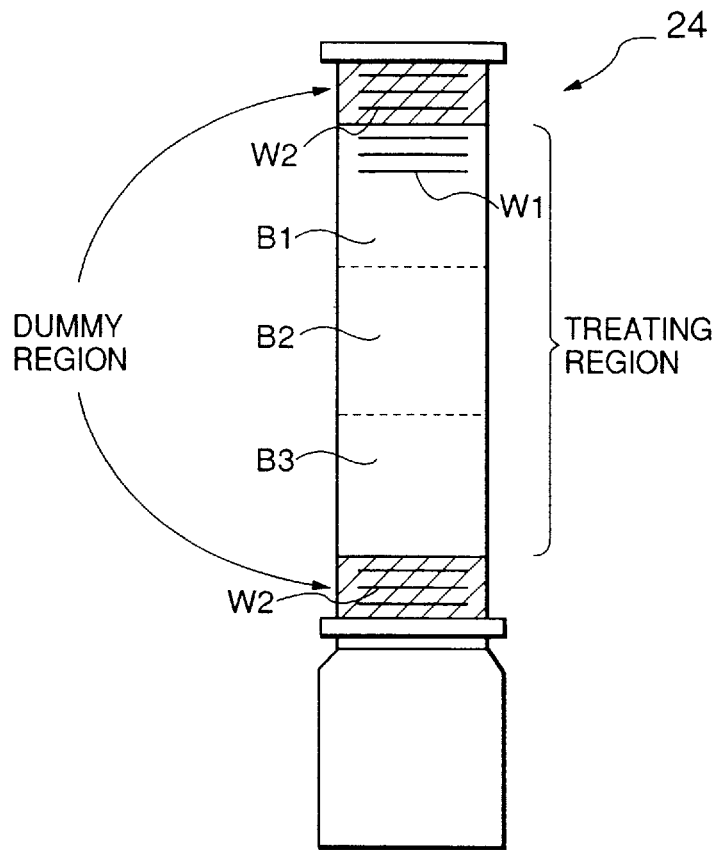
FIG. 4 is a side elevation of a wafer boat of the conventional vertical heat treating apparatus.
Figure 5:
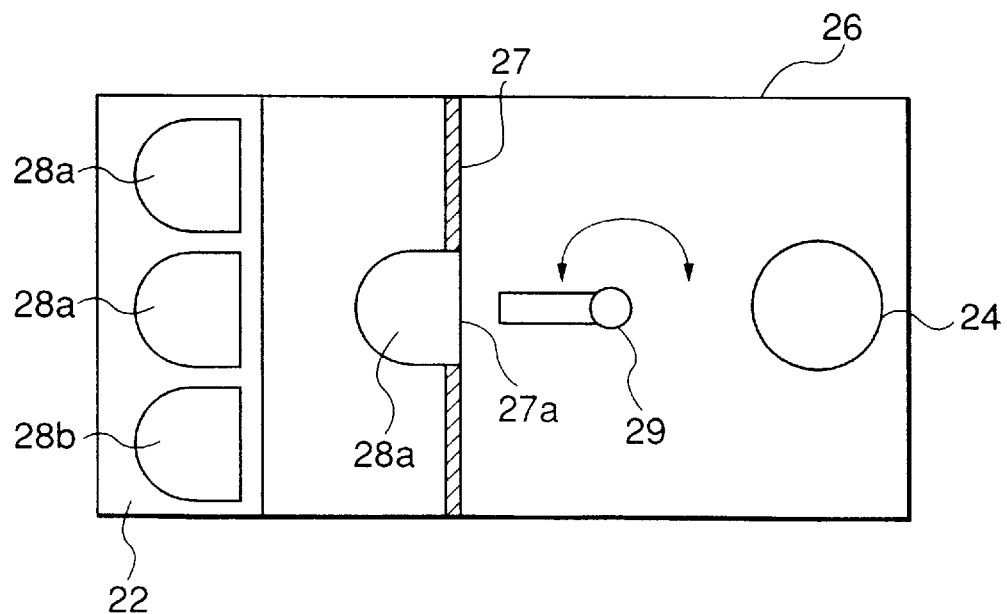
FIG. 5 is a plan view of the conventional vertical heat treating apparatus.
Figure 6:
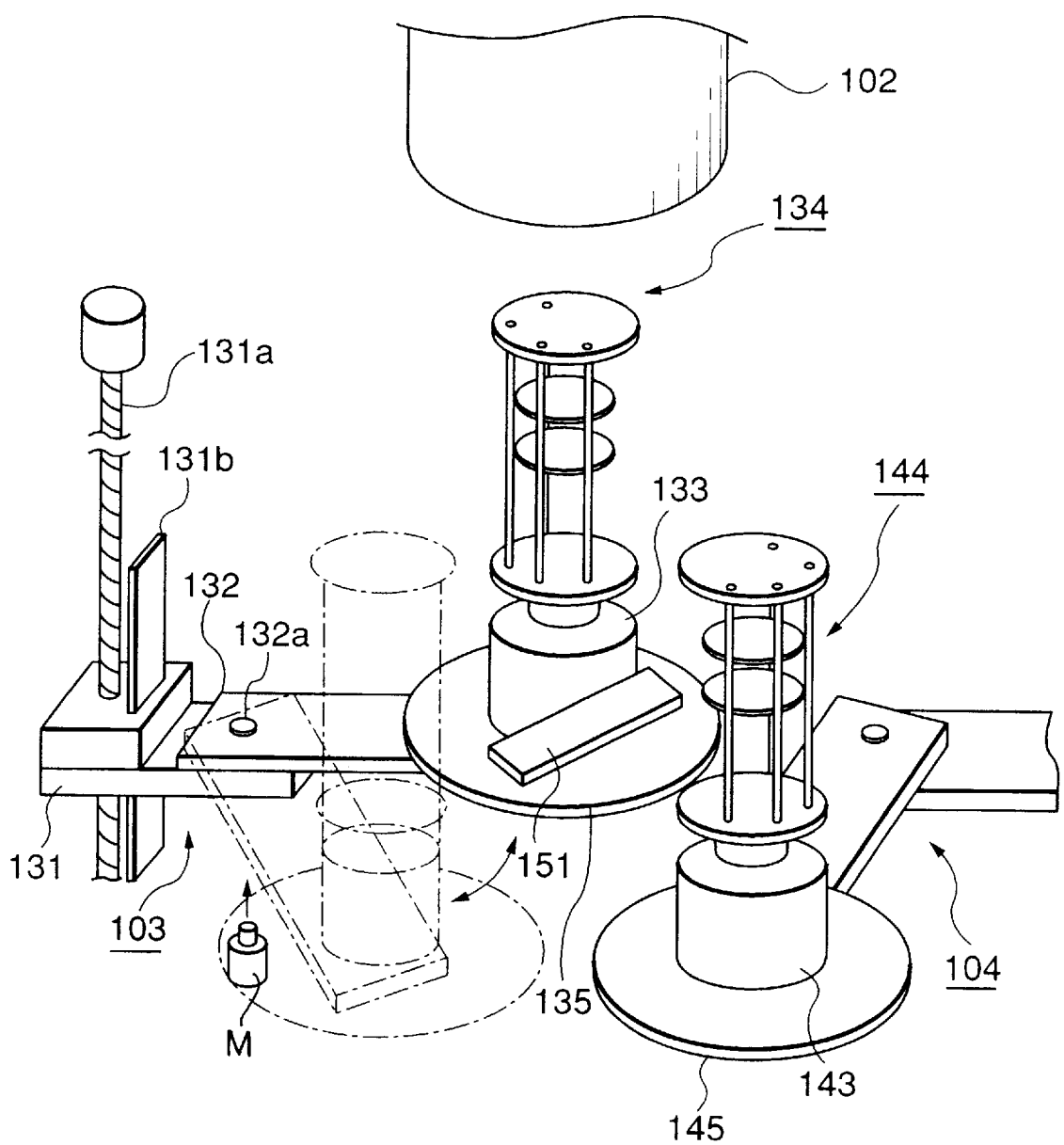
FIG. 6 is a perspective view illustrating a major part of the first preferred embodiment of a vertical heat treating apparatus according to the present invention.
Figure 7:
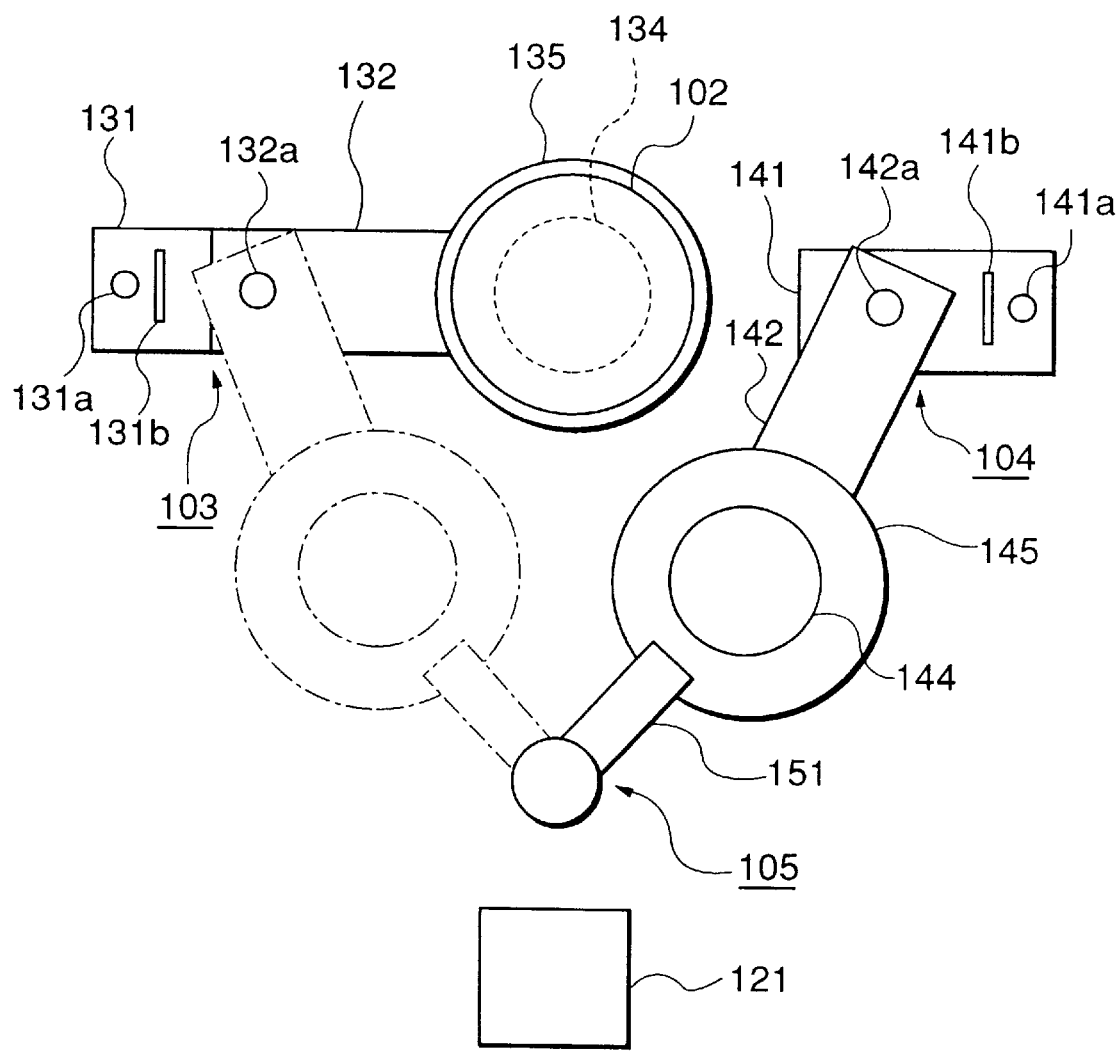
FIG. 7 is a plan view illustrating a major part of the first preferred embodiment of a vertical heat treating apparatus according to the present invention.

FIG. 6 is a perspective view illustrating a major part of the first preferred embodiment of a vertical heat treating apparatus according to the present invention, and FIG. 7 is a plan view thereof. In the drawings, reference number 102 denotes a vertical heat treating furnace which will be described later.

Below the heat treating furnace 102, a first boat elevator 103 serving as a first holder carrying means and a second boat elevator 104 serving as a second holder carrying means are provided so as to face each other on the right and left sides in the drawing. The first and second boat elevators 103 and 104 have the same structure. For convenience, the first boat elevator 103 will be described below.

The first boat elevator 103 has a lifting base 131 which is capable of moving upwards and downwards along a guide plate 131b while engaging a ball screw shaft 131a which extends vertically on the left side of a lower position of the heat treating furnace 102. The guide plate 131b is provided inside of the ball screw shaft 131a, and also serves as a heat insulating plate for protecting the screw shaft 131a from the radiation heat of the heat treating furnace 2.

In addition, a rotatable base 132, which is rotatable in horizontal directions by means of a vertical rotating shaft 132a driven by a motor M, is mounted on the lifting base 131. On the upper surface of the rotatable base 132, a lid 135 of the heat treating furnace 102 is mounted, and a first wafer boat 134 serving as a first holder is also mounted via a heat insulating cylinder 133 on the lid 135. The wafer boat 134 can hold, e.g., 100 semiconductor wafers W spaced arranged at regular intervals in vertical directions.

Similar to the first boat elevator 103, the second boat elevator 104 has a lifting member 141, a rotatable base 142, a lid 145 of the heat treating furnace 102, a heat insulating cylinder 143, and a second wafer boat 144. Thus, the first and second boat elevators 103 and 104 are designed to carry the first and second wafer boats 134 and 144 between a wafer transfer region and a predetermined position in the heat treating furnace 102.

In the wafer transfer region, a wafer transfer means 105 serving as means for transferring objects to be treated is provided. The wafer transfer means 105 has a wafer transfer arm 151 for transferring, e.g., a plurality of wafers W in a lump between the first and second wafer boats 134, 144, and the intermediate delivery portion 121.

Figure 8:
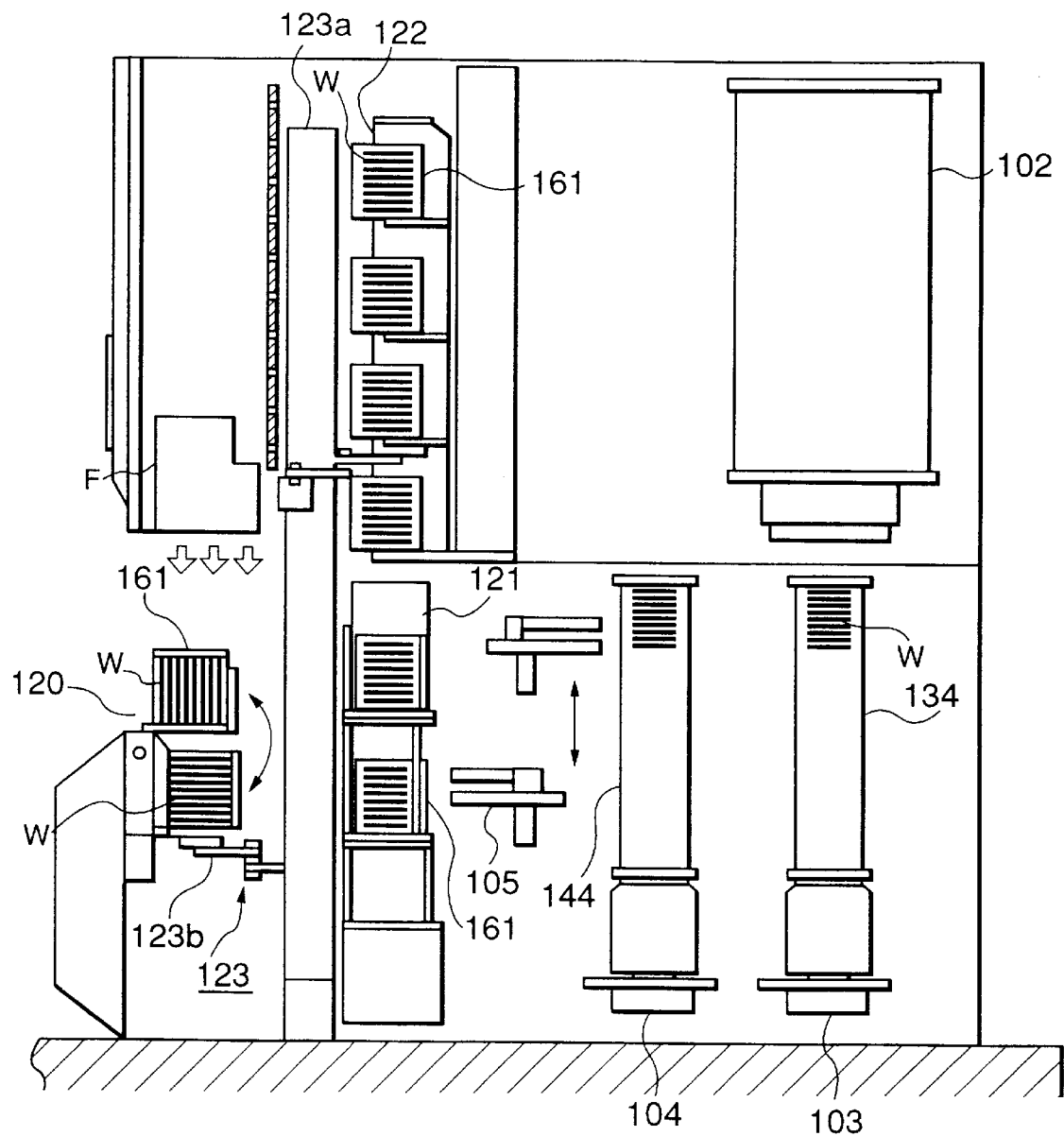
FIG. 8 is a cross sectional view of the first preferred embodiment of the whole vertical heat treating apparatus according to the present invention.

Referring to FIG. 8, the whole structure of the vertical heat treating apparatus including the wafer transfer region will be described. In this vertical heat treating apparatus, the heat treating furnace 102 is arranged in the inner part of the apparatus body. The first wafer boat 134 is arranged below the heat treating furnace 102, and the second wafer boat 144 is arranged in the wafer transfer region in front of the first wafer boat 134. In front of the second wafer boat 144, the wafer transfer means 105 is arranged. The wafer delivery portion 121 is arranged so as to face the second wafer boat 144 via the wafer transfer means 105, and a carrier 161 for housing therein the wafers W is set on the wafer delivery portion 121.

Above the wafer delivery portion 121, a carrier housing shelf 122 is provided. A moving region of a carrier transfer device 123 is arranged so as to face the wafer delivery portion 121 and the carrier housing shelf 122. In front of the moving region, an input/output port 120 of the wafer cassette 161 is arranged. The carrier transfer device 123 has a lifting base 123b which moves upwards and downwards along a strut 123a. In the drawing, F denotes an air filter portion.

Figure 9A:
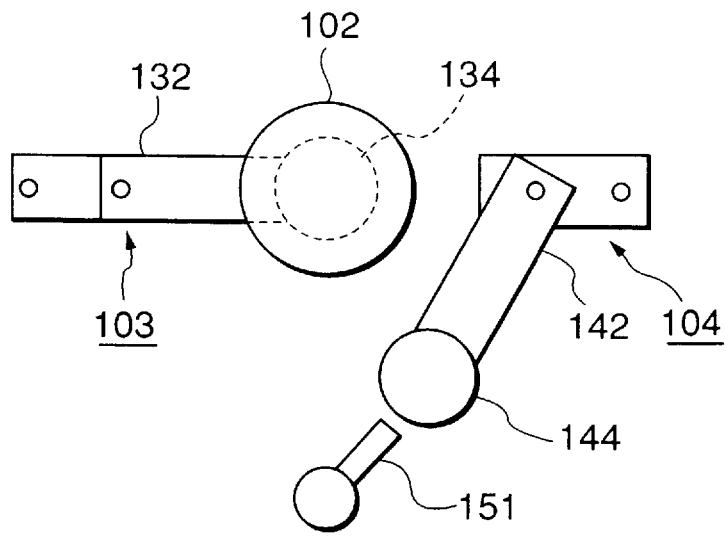
FIGS. 9A through 9C are views explaining the operation of the first preferred embodiment of a vertical heat treating apparatus according to the present invention.
Figure 9:
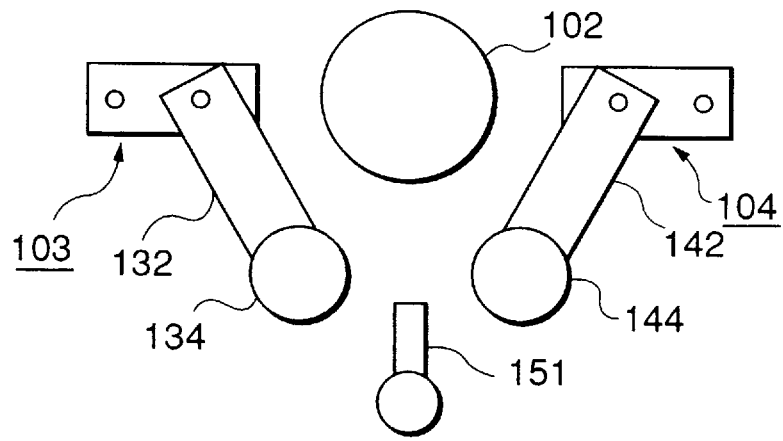
Figure 9:
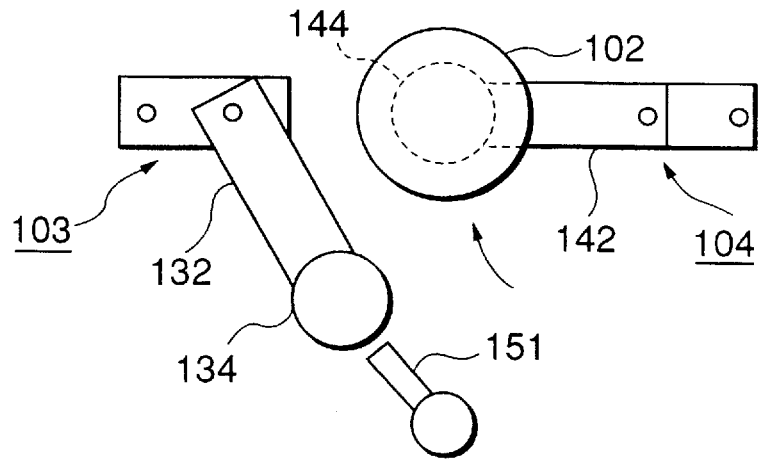

Referring to FIGS. 9A though 9C, the operation of the aforementioned vertical heat treating apparatus will be described below.

First, in a step shown in FIG. 9A, the first wafer boat 134 is carried to a predetermined position in the heat treating furnace 102 by means of the first boat elevator 103. Then, a given heat treatment of objects to be treated, e.g., the wafers W, which are held on the first wafer boat 134, is carried out. On the other hand, the rotatable base 142 of the second boat elevator 104 is arranged in the wafer transfer region, and the wafers W in the carrier 161 of the wafer delivery portion 121 are transferred to the second wafer boat 144 of the second boat elevator 104 by means of the wafer transfer arm 151.

Subsequently, in a step shown in FIG. 9B, the lifting member 131 of the first boat elevator 103 is moved downwards to a lower position below the heat treating furnace 102, and the first wafer boat 134 is carried out of the heat treating furnace 102 after the heat treatment is completed. Thereafter, the rotatable base 142 is rotated to move the wafer boat 134 from the lower position to the wafer transfer region. Then, the rotatable base 142 of the second wafer boat 144 is rotated from the wafer transfer region to the lower position below the heat treating furnace 102, and the lifting member 141 is moved upwards from the lower position to a predetermined position in the heat treating furnace 102 to carry the second wafer boat 144 in the heat treating furnace 102.

Then, in a step shown in FIG. 9C, the wafers W are transferred to the first wafer boat 134 in the wafer transfer region by means of the wafer transfer arm 151. Thus, while one wafer boat 134 (or 144) is in the heat treating furnace 102, the wafers W are transferred to the other wafer boat 144 (or 134) in the wafer transfer region, so that the two wafer boats 134 and 144 are alternately in the heat treating furnace 102 to carry out the heat treatment of the wafers W.

In such a vertical heat treating apparatus, the wafer boat 134 (or 144) is moved between the lower position below the heat treating furnace 102 and the wafer transfer region while being put on the boat elevator 103 (or 144), so that it is not required to move the wafer boat 134 (or 144) by means of the boat arm. Therefore, there is no problem of accumulating the position shifts of the wafer boat 134 (or 144), and it is possible to prevent the wafer boat 134 (or 144) from accidentally overturning due to the transfer of the wafer boat 134 (or 144).

In this preferred embodiment, while the wafers W have been transferred by means of a common wafer transfer means 105 for the first and second wafer boats 134 and 144, the wafers W may be transferred by means of separated wafer transfer means, respectively.

Figure 10:
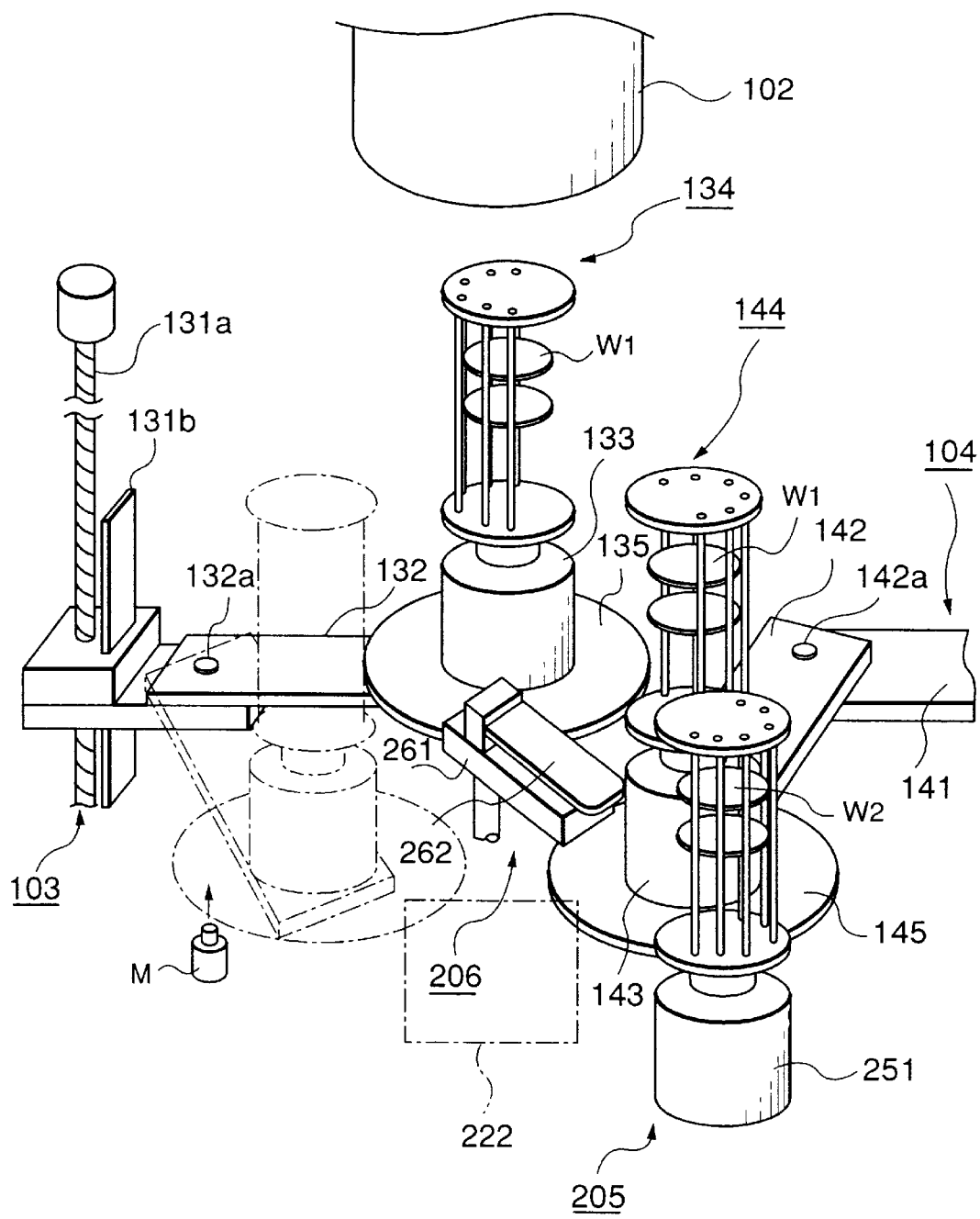
FIG. 10 is a perspective view illustrating the interior of a transfer chamber of the second preferred embodiment of a heat treating apparatus according to the present invention.
Figure 11:
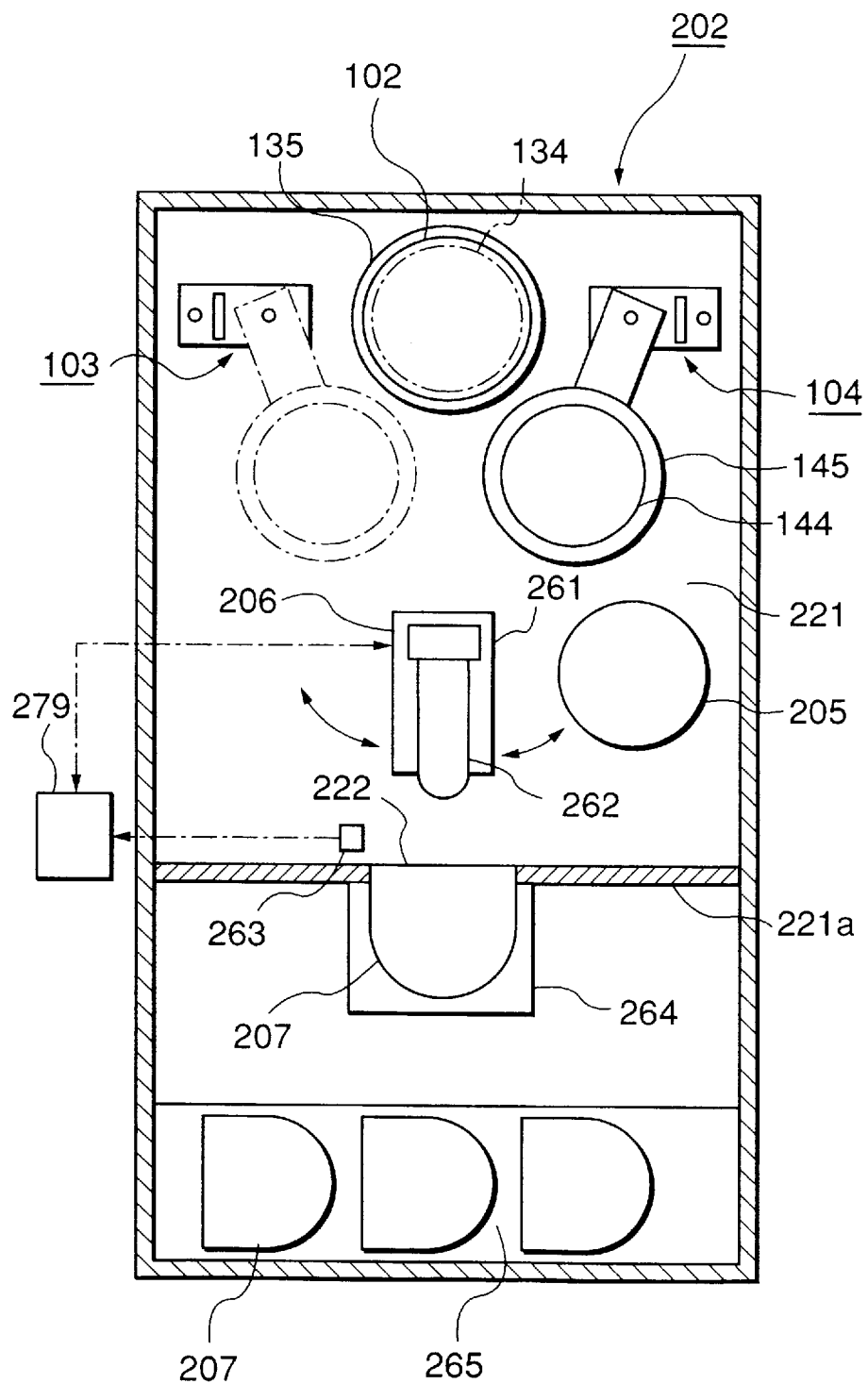
FIG. 11 is a plan view of the second preferred embodiment of a heat treating apparatus according to the present invention.
Figure 12:
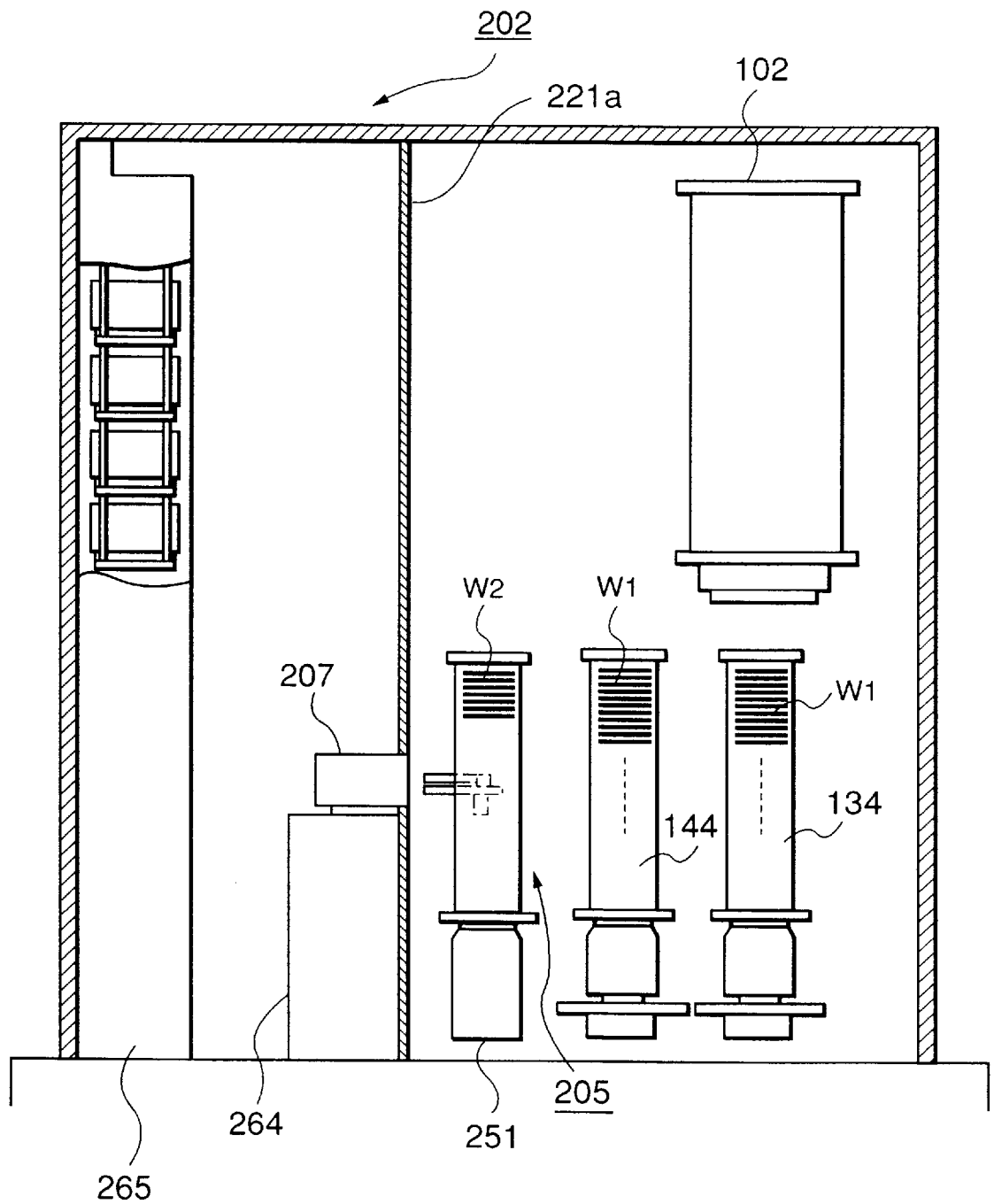
FIG. 12 is a cross sectional view of the second preferred embodiment of a heat treating apparatus according to the present invention.

FIG. 10 is a perspective view illustrating a major part of the second preferred embodiment of a vertical heat treating apparatus according to the present invention, FIG. 11 is a plan view thereof, and FIG. 12 is a side elevation thereof. In FIG. 11, reference number 221 denotes a transfer chamber. A front wall portion 221a of the transfer chamber 221 has a delivery port 222 for mounting thereon a closed-type cassette which will be described later. The delivery port 222 is usually closed by means of a lid (not shown).

Above the inner part of the transfer chamber 221, a heat treating furnace 102 is arranged. Below the heat treating furnace 102, two boat elevators 103 and 104 are arranged so as to face each other on the right and left sides in the drawing. The first boat elevator 103 has a first wafer boat 134, and the second boat elevator 104 has a second wafer boat 144. On the first and second wafer boats 134 and 144, e.g., 50 treated wafers W1 are arranged at regular intervals in vertical directions, respectively. Furthermore, the first and second wafer boats 134 and 144 of the first and second boat elevators 103 and 104 have the same structures as those in the first preferred embodiment shown in FIGS. 6 and 7, so that the descriptions thereof are omitted.

While one of the two wafer boats is carried in the heat treating furnace 102, the wafers W1 are transferred to the wafer transfer region of the other wafer boat. Thus, the wafer boats 134 and 144 are alternately carried in the heat treating furnace 102.

For example, in front of the boat elevator 104, a boat 205 for dummy wafers serving as a third holder for holding the dummy wafers W2 is arranged on, e.g., a mounting base 251. The dummy-wafer boat 205 has substantially the same structure as those of the wafer boats 134 and 144. That is, the dummy-wafer boat 205 generally comprises, e.g., a circular roof plate 252a, a circular bottom plate 252b, and six struts 253, which are arranged at regular intervals in a semi-circumferential direction so as to extend between the roof plate 252a and the bottom plate 252b, each of the struts having a plurality of holding grooves spaced at regular intervals. The dummy wafers W2 are introduced in a radial direction of the roof plate 252a (the bottom plate 252b) from a space between the adjacent struts so that the peripheral portions of the dummy wafers W2 are inserted into the corresponding holding grooves. Thus, the dummy-wafer boat 205 can hold, e.g., 50 dummy wafers W2 at regular intervals in vertical directions.

In a case where the number of the wafers W1, which can be loaded on the first wafer boat 134, is insufficient, the dummy wafers W2 are loaded on the dummy-wafer boat in order to fill the insufficiency of the wafers W1. The dummy wafers W2 also include wafers which are previously arranged at the upper and lower end portions, i.e., at regions wherein the temperature difference from a set temperature is great and the quality is slightly poor.

Right behind the delivery port, a wafer transfer means 206 is provided. The wafer transfer means 206 comprises a rotatable base 261 which can move upwards and downwards, and a plurality of retractable transfer arms 262 provided thereon (only one transfer arm is illustrated for convenience). The transfer arm 262 transfers, e.g., a plurality of wafers W1 in a lump between a closed-type cassette, which will be described later, and the wafer boats 134 and 144. The transfer arm 262 also transfers, e.g., a plurality of dummy wafers W2 in a lump between the dummy-wafer boat 205 and the wafer boats 134 and 144. Alternatively, the transfer arm 262 may transfer the wafers W1 and the dummy wafers W2 one by one.

A wafer counter 263 serving as a treated-substrate counter for counting the number of the wafers W1 in the closed-type cassette is provided so as to face the delivery port 222. The wafer counter 263 has, e.g., a light reflection type sensor for scanning from the uppermost stage to the lowermost stage of the cassette to detect the presence of the wafers W1 in the cassette using the light reflected from the peripheral portions of the wafers W1. The detected information is stored in a memory of a control section 279. On the basis of this information (mapping information), the control section 279 recognizes the arrangement of the wafers in the cassette, and determines as to which stage (groove number) on the boat should be filled by the dummy wafers W2, to output an access command for the dummy wafers W2 from a controller (not shown) to the transfer means 262.

Below the delivery port 222 outside of the transfer chamber 221, a mounting base 264 for the closed-type cassette is provided. As shown in FIGS. 11 and 12, above a location in front of the delivery port 222, a cassette housing portion, e.g., a stocker 265, for housing a plurality of closed-type cassettes at regular intervals in vertical directions, is provided. The closed-type cassettes are carried by means of a carrying mechanism (not shown) between the mounting base 264 and the stocker 265.

Figure 13:
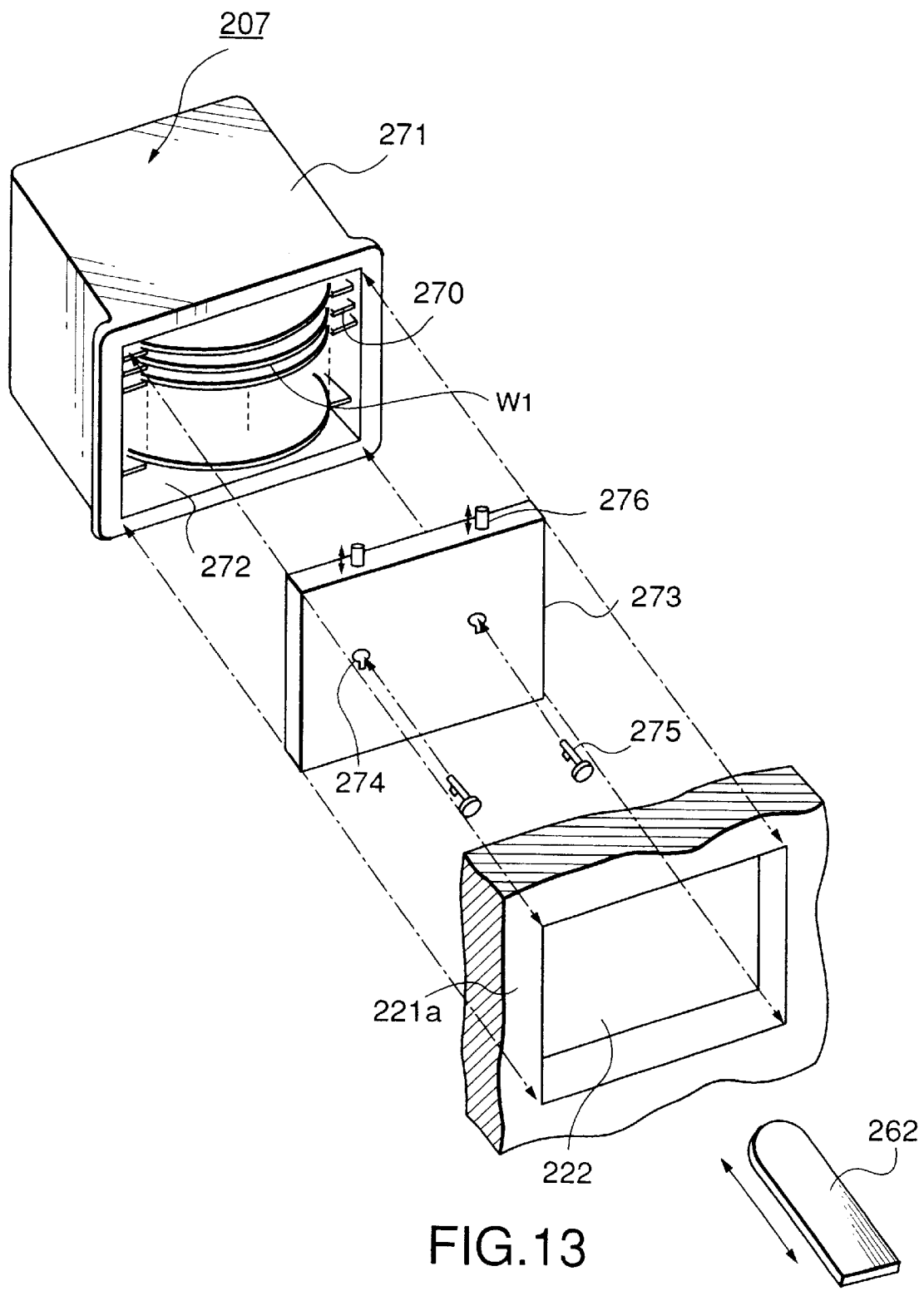
FIG. 13 is a perspective view of a closed-type cassette in the second preferred embodiment of a heat treating apparatus according to the present invention.

Referring to FIG. 13, a closed-type cassette 207 (which will be hereinafter referred to as a "cassette 207"), which is transferred from the outside of the transfer chamber 221 to the delivery port 222 of the wall portion 221a to be brought into tightly contact therewith, will be briefly described. The cassette 207 comprises a cassette body 271 having multi-stage slots 271 for holding, e.g., 13 wafers W1, and a lid 273 for tightly closing an opening 272 serving as a wafer ejecting port.

The lid 273 is inserted into the opening 272 of the cassette body 271. The lid 273 has, e.g., two key holes 274. When keys 275 are inserted into the key holes 274 to be rotated, e.g., four lock pins 276 project from the upper and lower ends of the lid 273 so that the lid 273 is fixed to the cassette body 207. Such a cassette 207 is mounted on the delivery 222 of the wall portion 221a from the outside.

Figure 14A:
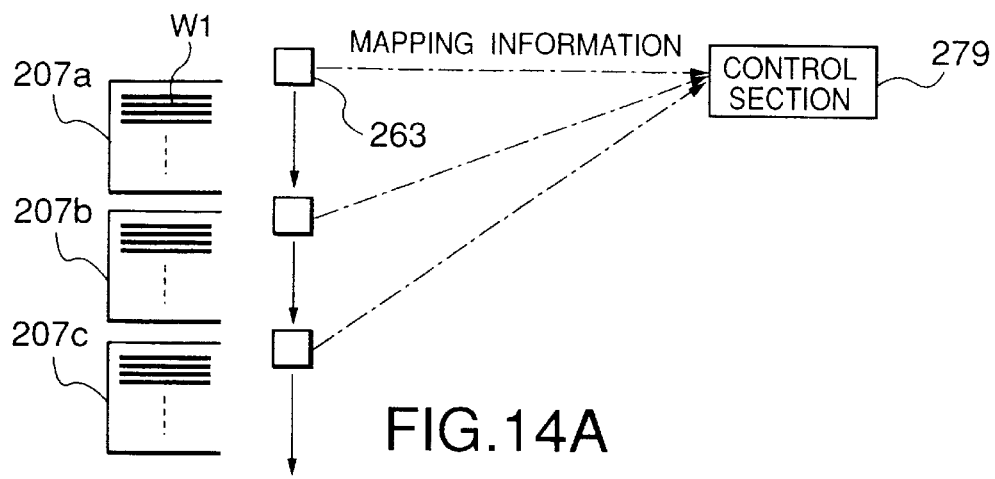
FIGS. 14A through 14C are views explaining the operation of the second preferred embodiment of a heat treating apparatus according to the present invention.
Figure 14B:
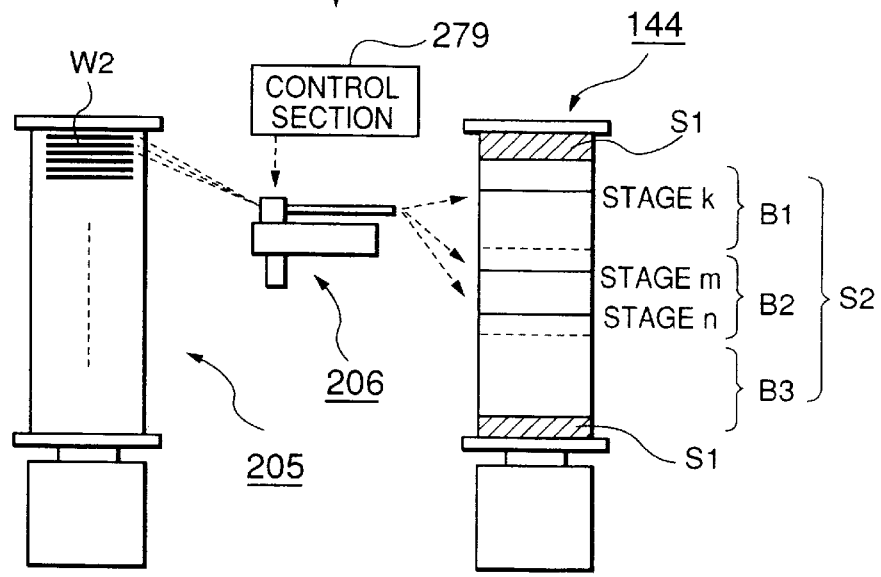
Figure 14C:
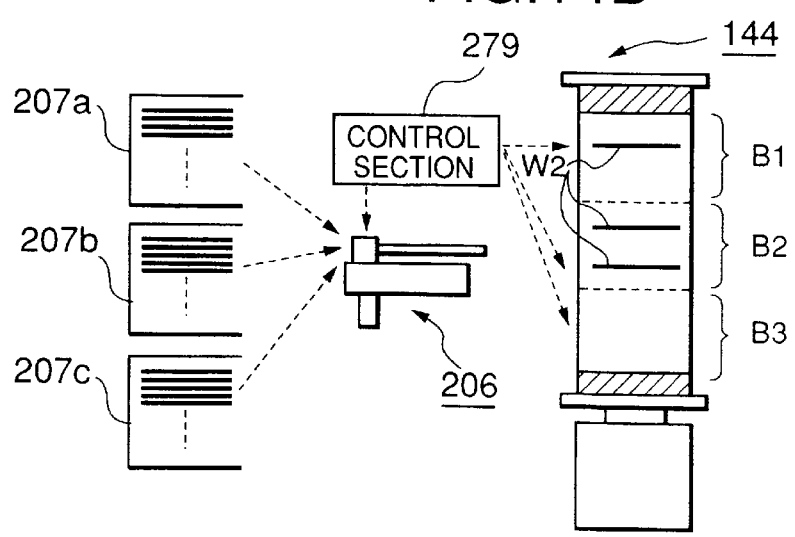

Referring to FIGS. 14A through 14C, the operation of such a heat treating apparatus will be described below.

It is now assumed that one wafer boat 134 is carried in the heat treating furnace 102 to carry out the heat treatment of wafers W1 held on the wafer boat 134, and the transfer of the next wafers W1 to be treated to the other wafer boat 144 is started.

Outside of the transfer chamber 221, a first cassette 207a is loaded on the mounting base from the stocker 265 by means of the transfer mechanism (not shown), to be mounted on the delivery port 222 of the transfer chamber 221 from the outside. Then, by means of an opening and closing mechanism, the keys 275 are inserted into the corresponding key holes 274 and rotated to release the lock pins 276 to open the lid 273 together with the lid for closing the delivery port 222. Then, the wafer counter 263 detects the arranged state of the wafers W1 stored in the cassette 207a, i.e., as to which slot 270 has a wafer W1 and which slot 270 has no wafer W1, and this information is stored in the memory of the control section 279 (FIG. 14A).

As mentioned above, on the wafer boat 144, the dummy wafers W2 are previously loaded in upper and lower regions S1 shown by slanting lines in the drawing. The wafer boat 144 also has a treating region S2 other than the regions S1. The treating region S2 is divided into, e.g., three blocks B1, B2 and B3 corresponding to the first cassette 207a, a second cassette 207b and a third cassette 207c, respectively. It is now assumed that the cassette 207a has no wafer W1 which is to be held in a groove of number k of the wafer boat 144.

Subsequently, as shown in FIG. 14B, on the basis of the arranged state of the wafers W1, the dummy wafers W2 are transferred by the wafer transfer means 206 from the dummy-wafer boat 205 to the wafer boat 144. That is, in response to the access command on the transfer of the dummy wafers W2 outputted from the control section 279, the wafer transfer means 206 takes three dummy wafers W2 out of the dummy-wafer boat 205, and loads the dummy wafers W2 in the groove of number k of the wafer boat 144.

After the dummy wafers W2 are thus transferred, the wafers W1 are transferred by the wafer transfer means 206 from the cassette 207a to the wafer boat 144 as shown in FIG. 14C. That is, in response to the access command on the transfer of the wafers WI outputted from the control section 279, the wafer transfer means 206 takes the wafers W1 out of the cassette 207a, and loads the wafers W1 in the corresponding grooves, other than the groove of number k, of the wafer boat 144. Subsequently, the cassette 207a is replaced by the cassette 207b, and the arranged state of the wafers W1 in the cassette 207b are detected in the same manner as that of the aforementioned manner. After the dummy wafers W2 are transferred to the grooves of numbers m and n of the wafer boat 144, and the wafers W1 are transferred to the residual grooves. Similarly, the cassette 207b is replaced by the cassette 207c, and the wafers W1 in the cassette 207c are transferred to the wafer boat 144.

After the wafers W1 and the dummy wafers W2 are thus transferred to the wafer boat 144, the wafer boat 134 is first carried out of the heat treating furnace 102, and then, the wafer boat 144 is carried in the heat treating furnace 102 to carry out the heat treatment of the wafers W1 loaded on the wafer boat 144.

On the other hand, the wafers W1 loaded on the wafer boat 134 after treatment are first transferred to the cassette 207 (207a, 207b, 207c) by the wafer transfer means 206, and then, the supplementary dummy wafers W2 loaded on the wafer boat 134 are transferred to the dummy wafer boat 205 by the wafer transfer means 206. After the transfer of the wafers W1 to the cassette 207 is completed, the lid 273 of the cassette 207 and the lid for closing the delivery port 222 are closed. Outside of the transfer chamber 221, the cassette 207 housing therein the wafers W1, which have been treated, is transferred to the stocker 265, and then, the cassette 207 housing therein the wafers W1, which have not been treated, is transferred from the stocker 265 to the mounting base 264.

In such a heat treating apparatus, the boat 205 for dummy wafers is provided in the transfer chamber 221, and the dummy wafers W2 are transferred from the dummy-wafer boat 205 to the wafer boat 134 (or 144). Therefore, it is not required to prepare a cassette for dummy wafers to mount the cassette on the delivery port 222. This is very effective to make a sequence for transferring the wafers W1 and the dummy wafers W2 in a case where the closed-type cassette 207 is used.

Because it takes a lot of time to carry out the mounting operation of the closed-type cassette 207 on the delivery port 222, including the opening and closing operation of the lids, and the removing operation thereof. If the dummy-wafer boat 205 is not used, complicated steps must be carried out so that after the number of the wafers WI in the treating cassette is counted, this cassette is removed from the delivery port, and then, the cassette for dummy wafers is loaded to transfer the dummy wafers W2, and thereafter, the treating cassette is mounted again to transfer the wafers W1 to the wafer boat.

Since such complicated steps are not required in this preferred embodiment, the transfers of the wafers W1 and the dummy wafers W2 to the wafer boat can be easily carried out and the program for the transfer steps can be simple, in comparison with the method for transferring the dummy wafers W2 from the stocker to the wafer boat via the dummy-wafer cassette. In addition, it is possible to remarkably decrease the time required for these transfers.

Moreover, since the dummy-wafer boat 205 is provided in the transfer chamber 221, it is not required to prepare any additional cassettes for dummy wafers, and it is also not required to house the cassette for dummy wafers in the stocker 265. Therefore, since only the treating cassettes before and after the heat treatment are housed in the stocker 265, it is possible to increase the number of the treating cassettes which can be housed in the stocker 265.

When the number of the treating cassettes, which can be housed in the stocker 265, is thus increased, the number of the treating cassettes after the heat treatment is also increased. The carrying operations of the treating cassettes between the outside of the heat treating apparatus and the stocker 265 are carried out by an operator when, e.g., the number of the treating cassettes after the heat treatment reaches a certain number (when the number of the treating cassettes before the heat treatment is decreased). Therefore, if the number of the treating cassettes received after the heat treatment is increased, the number of the replaced treating cassettes received before the heat treatment is also increased.

When the number of the wafers received in the stocker 265 before the heat treatment is less than the number of wafers corresponding to that in one batch processing, the cassette housing therein the wafers after the heat treatment must be taken out to be supplemented. The probability of causing such a state is decreased if the number of the received treating cassettes is increased. Therefore, the number of the replacing operations can be decreased, so that the number of operations by the operator can be decreased.

Figure 15A:
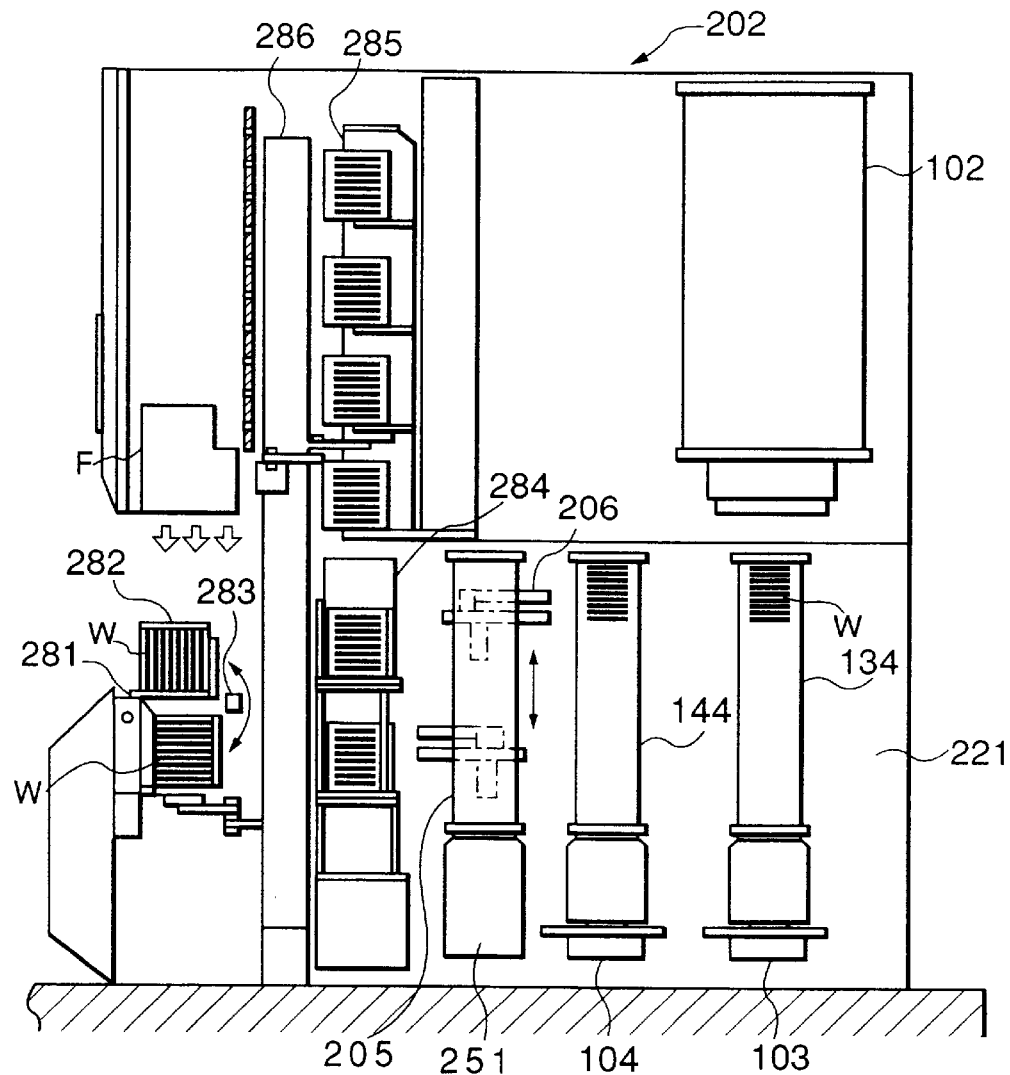
FIG. 15A is a cross sectional view of the third preferred embodiment of a heat treating apparatus according to the present invention.
Figure 15B:
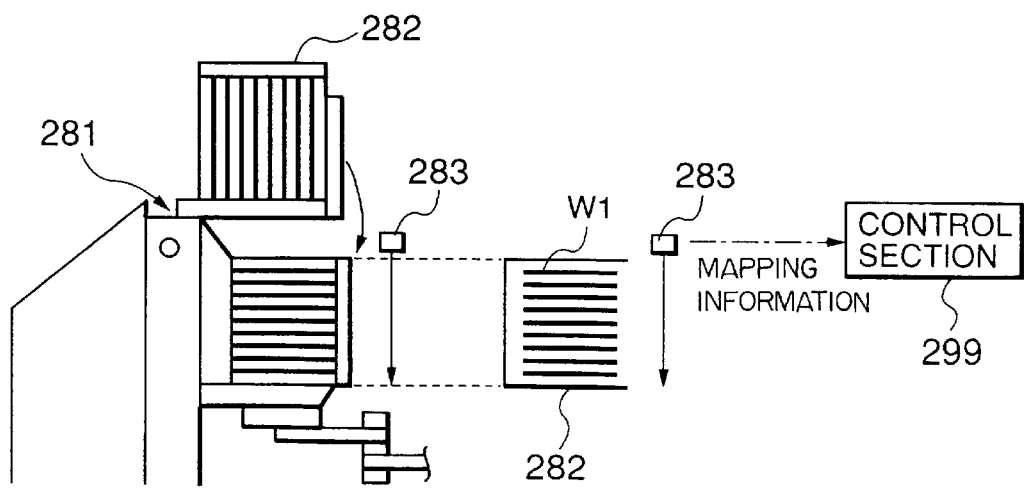
FIG. 15B is a view explaining a method for deriving a mapping information on wafers in a cassette of the heat treating apparatus of FIG. 15A.

Referring to FIGS. 15A and 15B, the third preferred embodiment of the present invention will be described below.

This preferred embodiment is the same as the aforementioned second preferred embodiment, except that open-type cassettes are substituted for the closed-type cassettes as the treating cassettes housing therein treated wafers. In FIGS. 15A and 15B, reference number 281 denotes a cassette stage serving as an input/output port for a cassette for substrates to be treated, e.g., a treating cassette 282 (which will be hereinafter referred to as a "cassette 282"). The cassette stage 281 is formed so that the rotation axis 281a thereof lies down by 90 degrees toward the inner part, i.e., so that each of vertically arranged wafers in the cassette 282 extends in horizontal directions.

A wafer counter 283 is provided so as to face the horizontal wafers near the cassette stage 281. The wafer counter 283 is usually arranged below the laying cassette 282, and moves to the upper side of the cassette 282 after the cassette 282 moves so as to lie down.

Behind the cassette stage 281, a wafer delivery portion 284 is provided. The wafer delivery portion 284 is formed as, e.g., a three-stage shelf serving as a delivery loading portion, on which the cassette 282 is loaded. Above the wafer delivery portion 284, a stoker 285 housing therein a plurality of cassette 282 is provided. The cassette 282 is carried by means of a carrier mechanism 286 between the cassette stage 281 and the wafer delivery portion 284 and the stocker 285. Similar to the aforementioned second preferred embodiment, a wafer transfer means 206, a boat 205 for dummy wafers, and wafer boats 134 and 144 are arranged behind the wafer delivery portion 284. Other structures are the same as those of the second preferred embodiment.

In such a heat treating apparatus, as shown in FIG. 15B, when the cassette stage 281 loading thereon the cassette 282 moves so as to lie down, the wafer counter 283 scans from the uppermost part to the lowermost part of the cassette 282 to detect the arranged state of wafers W1 in the cassette 282, and this mapping information is stored in a memory of a control section 299. Then, the cassette 282, the arranged state of which has been recognized, is temporarily housed in the stocker 285 by means of the carrier mechanism 286.

Thereafter, three cassettes 282 are carried from the stocker 285 to the wafer delivery portion 284. Then, on the basis of the arranged state of the wafers W1, the dummy wafers W2 are transferred from the dummy-wafer boat 205 to the wafer boat 144 using the wafer transfer means 206. Thereafter, the wafers W1 are transferred from the cassette 282 to the wafer boat 144 using the wafer transfer means 206.

Also in this preferred embodiment, in a case where the dummy wafers W2 are transferred to the wafer boat 134 (or 144), the dummy wafers may be transferred between the dummy-wafer boat 205 and the wafer boat 134 (or 144), which are provided in the transfer chamber 221. Therefore, it is not required to take the cassette for dummy wafers out of the outside of the transfer chamber, so that it is possible to easily and quickly carry out the transfer of the dummy wafers W2. In addition, it is not required to house the cassette for dummy wafers in the stocker 285, so that it is possible to increase the space for receiving the cassettes 282. Therefore, it is possible to decrease the number of operations for replacing the treating cassettes before and after heat treatment, by the operator between the stocker 285 and the outside of the apparatus.

The present invention should be limited to a vertical heat treating apparatus having two wafer boats, but it may also be applied to a vertical heat treating apparatus a single wafer boat. In this case, since the time required to transfer the treated wafers and the dummy wafers to the wafer boat has an influence upon the throughput, it is effective to decrease the time required to transfer the wafers to improve the throughput. In addition, according to the present invention, an ultrasonic sensor may be used as the wafer counter. Moreover, in a case where a closed-type wafer cassette is used, the opening and closing mechanism for the lids and so forth are large-scale. Therefore, it is desired to use a single delivery port since it is possible to decrease the costs and the space. However, e.g., three delivery ports may be provided at regular intervals in vertical direction for mounting the wafer cassette on each of the delivery ports.

Figure 16:
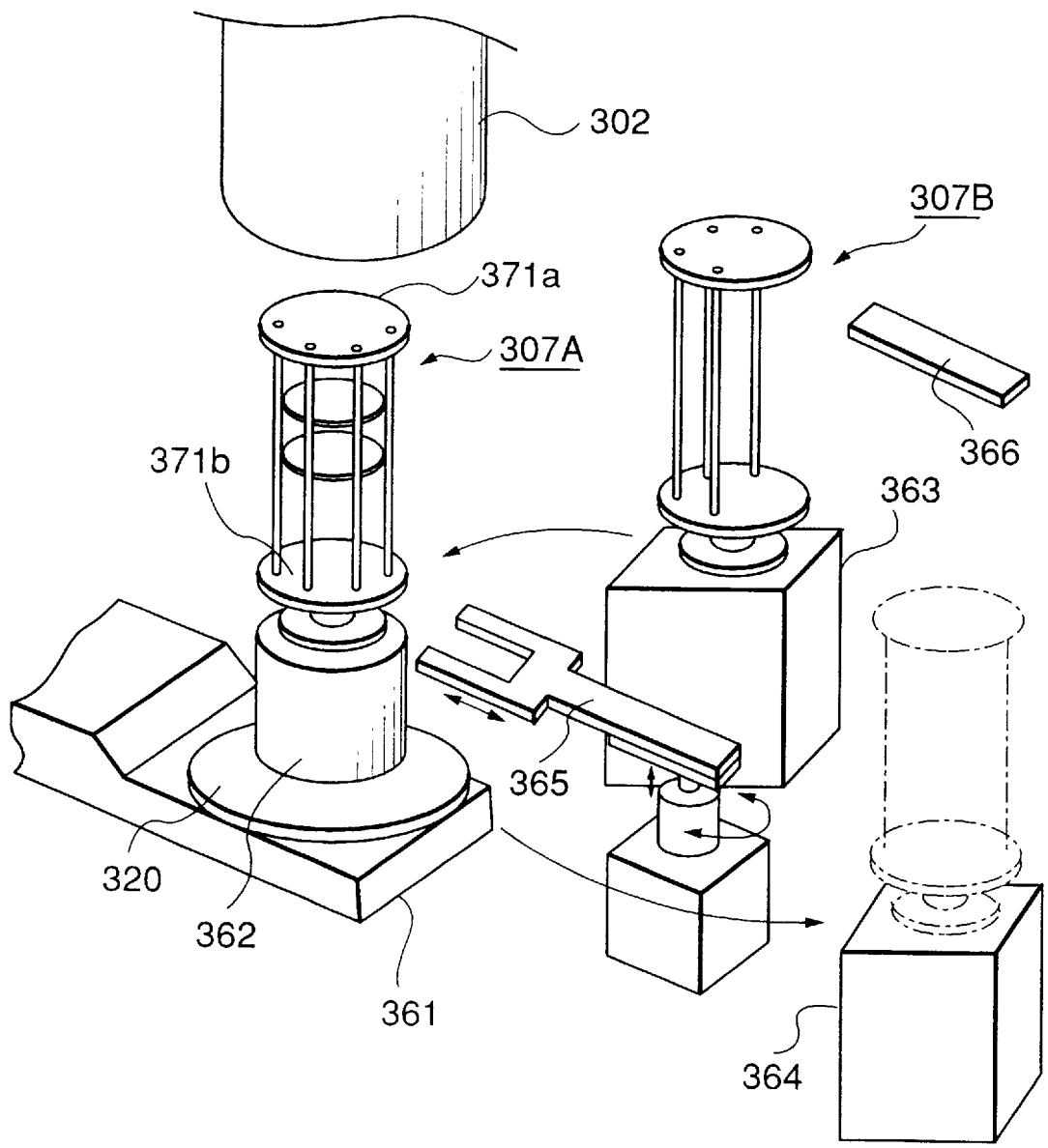
FIG. 16 is a perspective view illustrating a major part of the fourth preferred embodiment of a vertical heat treating apparatus according to the present invention.

Referring to FIG. 16, the fourth preferred embodiment of the present invention will be described below.

FIG. 16 is a perspective view of this preferred embodiment of a vertical heat treating apparatus according to the present invention. This preferred embodiment is characterized by cutouts formed at the lower end portion of a wafer boat and a forcibly positioning mechanism provided on a wafer transfer stage for loading thereon the wafer boat to transfer wafers. Unlike the aforementioned first preferred embodiment, this preferred embodiment is applied to an apparatus having a single boat elevator similar to the conventional apparatus.

In FIG. 16, the reference number 361 denotes a boat elevator serving as a holder lifting means which can move upwards and downwards. On the upper surface of the boat elevator 361, a heat insulating member, e.g., a heat insulating cover 362, is provided via a lid 320 of the heat treating furnace 302. On the heat insulating cover 362, a first wafer boat 307A serving as a first holder is loaded. The boat elevator 361 carries the wafer boat 307A loaded thereon between a predetermined position in the heat treating furnace 302 and a lower position.

In a region remote from the lower position of the heat treating furnace 302, a wafer transfer stage 363 serving as a holder loading portion and an intermediate stage 364 are provided. On the upper surface of the wafer transfer stage 363, a second wafer boat 307B serving as a second holder is loaded. The first wafer boat 307A has the same structure as that of the second wafer boat 307B (which will be hereinafter referred to as a "wafer boat 307" for convenience). The wafer boat 307 is made of, e.g., quartz or Sic, and can house therein, e.g., 100 semiconductor wafers W at regular intervals in vertical directions between a roof plate 371a and a bottom plate 371b.

Figure 17:
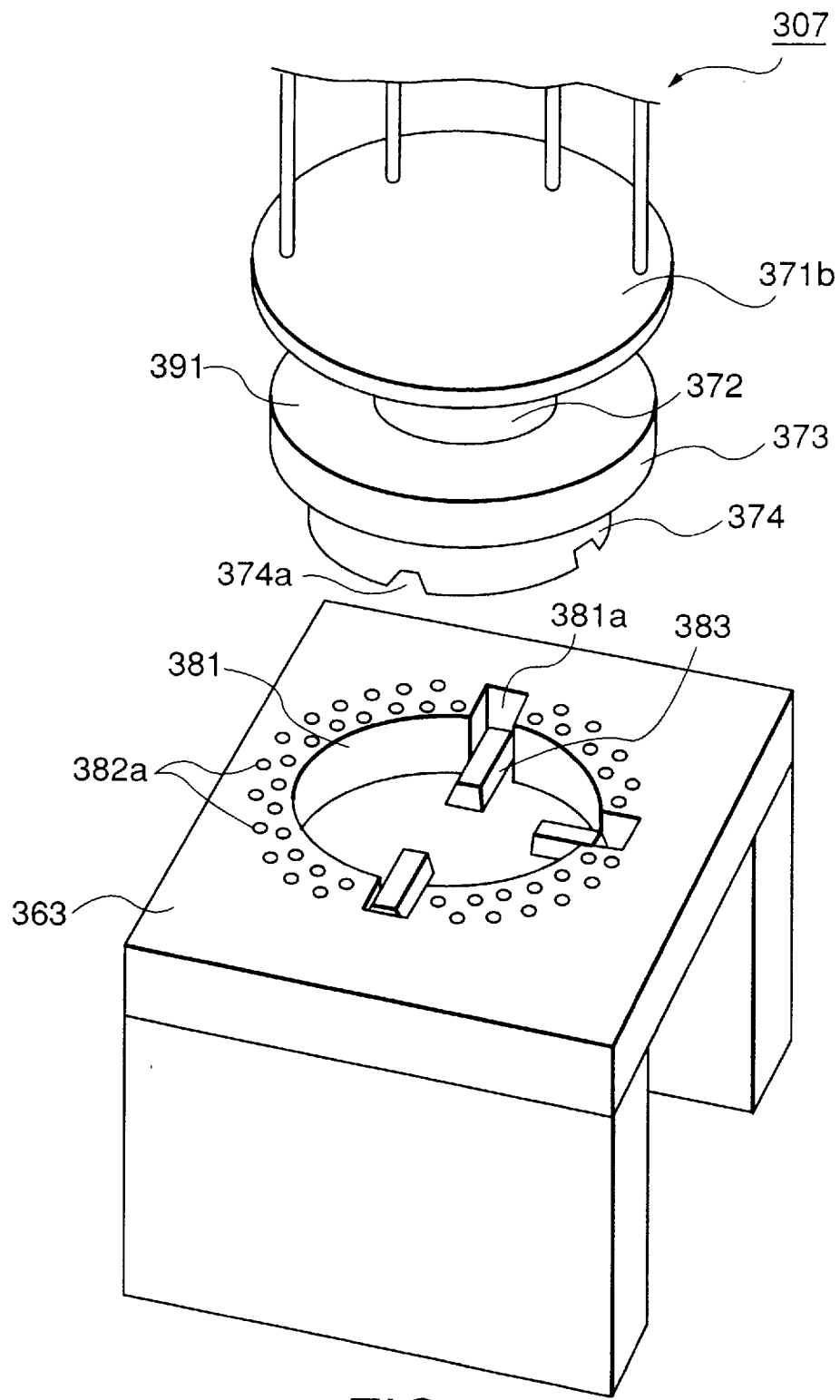
FIG. 17 is a perspective view illustrating a part of a wafer boat and a wafer transfer stage in the fourth preferred embodiment.

For example, as shown in FIGS. 17 and 19, below the bottom plate 371b, a loaded plate 373 is provided to be loaded on the loading face of the wafer transfer stage 363 via a support shaft 372. Below the loaded plate 373, an annular projecting portion 374 is formed. The lower end portion of the annular projecting portion 374 has three cutouts 374a serving as engaging portions at three locations thereof.

Figure 18:
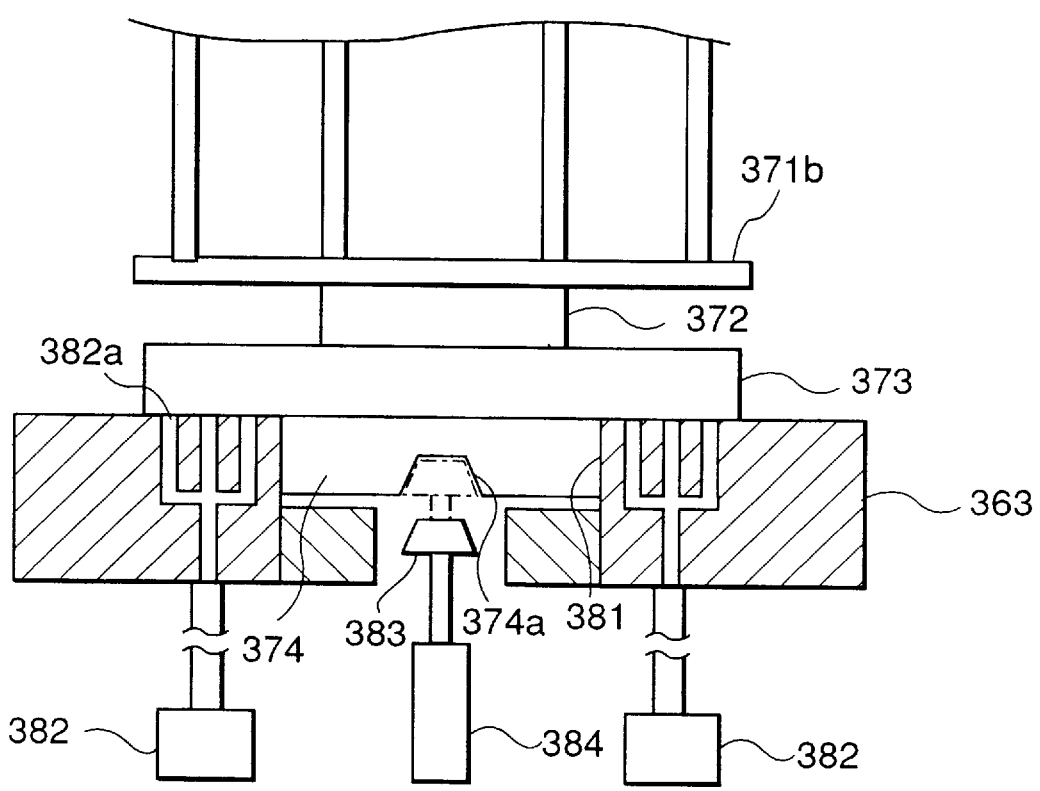
FIG. 18 is a cross sectional view illustrating the state that a wafer boat is loaded on a wafer transfer stage in the fourth preferred embodiment of a vertical heat treating apparatus according to the present invention.

For example, as shown in FIGS. 17 and 18, on the upper surface of the wafer transfer stage 363, a circular recessed portion 381 for engaging the annular projecting portion 374 of the wafer boat 307 is formed. The inner diameter of the recessed portion 381 is slightly greater than the outer diameter of the annular projecting portion 374. For example, when the outer diameter of the annular projecting portion 374 is 200 mm, the inner diameter of the recessed portion 381 is set to be about 205 mm. A portion of the upper surface of the wafer transfer stage 363 surrounding the outer periphery of the recessed portion 381 serves as a loading face for the wafer boat 307. A plurality of air supply holes 382a connected to an air supply means 382 serving as a gas supply means are formed in the portion of the loading face contacting the mounted plate of the wafer boat 307.

The recessed portion 381 is provided with three guide members 383 which extend between the recessed portion 381 and cutouts 381a formed therein, e.g., at locations shifted from each other by 90 degrees. The guide member 383 has a shape suitable for the cutout 374a formed in the annular projecting portion 374 of the wafer boat 307, e.g., a trapezoidal shape, and is made of, e.g., a metal coated with Teflon for decreasing frictional force.

Below the guide member 383, a pushing mechanism 384 of, e.g., a cylinder, is provided. When the wafer boat engages the recessed portion 381, the guide members 383 are pushed up by means of the pushing mechanism 384 so as to engage the cutouts 374a.

As shown in FIG. 16, at the center of the region surrounded by the boat elevator 361 and the wafer transfer stage 363 and the intermediate stage 364, a boat transfer arm 365 serving as a transfer means is provided.

The boat transfer arm 365 is movable upwards and downwards, rotatable, and retractable. The boat transfer arm 365 is inserted into a space 391 between the bottom plate 371b and the loaded plate 373 of the wafer boat 307 to lift and transfer the wafer boat 307 to the wafer transfer stage 363, the heat insulating cover 362 on the boat elevator 361, and the intermediate stage 364. Furthermore, in FIG. 16, reference number 366 denotes a wafer transfer arm serving as a treated-object transfer means for transferring wafers W between the second wafer boat 307B loaded on the wafer transfer stage 363 and the carrier of a wafer delivery portion (not shown).

The operation of such a vertical heat treating apparatus will be described below.

Assuming that the heat treatment is now completed and the boat elevator 361 is moved downwards to carry the first wafer boat 307A out, the first wafer boat 307A is first transferred to the intermediate stage 364 by means of the boat transfer arm 365. Then, the second wafer boat 307B, which loads thereon wafers W before treatment and which is loaded on the wafer transfer stage 363, is transferred to be loaded on the heat insulating cover 362 of the boat elevator 361 by means of the boat transfer arm 365, and is carried in the heat treating furnace 302 to carry out the treatment. On the other hand, the first wafer boat 307A is transferred from the intermediate stage 364 to the wafer transfer stage 363 by means of the boat transfer arm 365 to carry out the transfer of wafers W therein.

Figure 19A:
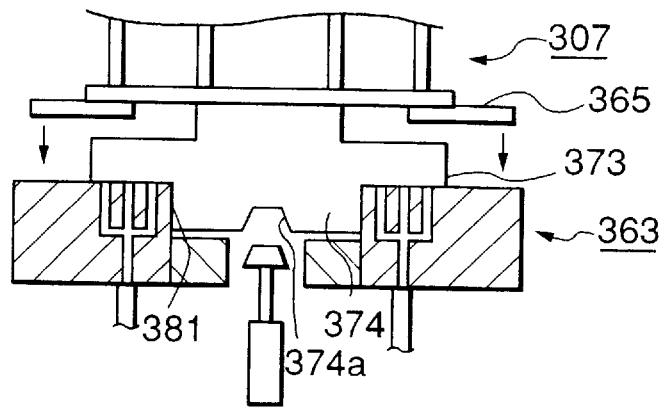
FIGS. 19A through 19C are views explaining the operation of the fourth preferred embodiment of a vertical heat treating apparatus according to the present invention.
Figure 19B:
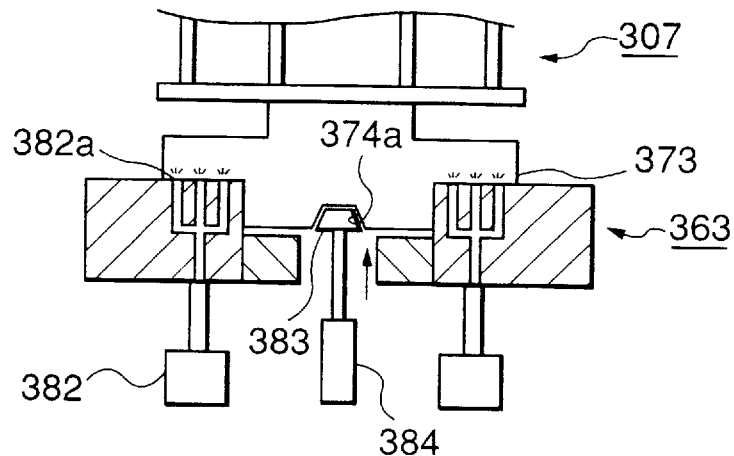

The wafer boat 307 is loaded on the wafer transfer stage 363 in the following manner. First, as shown in FIG. 19A, the boat transfer arm 365 is moved downwards to cause the annular projecting portion 374 of the wafer boat 307 to engage the recessed portion 381 of the wafer transfer stage 363 so that the lower face of the loaded plate 373 is loaded on the loading face. Then, as shown in FIG. 19B, after the boat transfer arm 365 is released, the guide member 383 is pushed up by the pushing mechanism 384, and air is supplied to the loading face via the air supply holes 382a using the air supply means 382.

Figure 19C:
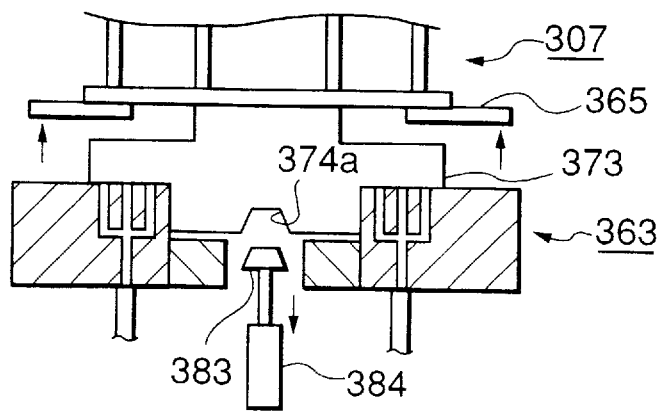

Thus, as shown in FIG. 19C, in a case where the center or radial position of the wafer boat 307 is shifted so that the guide members 383 are not in conformity with the corresponding cutouts 374a when the boat transfer arm 365 is released, the wafer boat 307 moves in a circumferential or radial direction to a position at which the guide members 383 is in conformity with the corresponding cutouts 374a, so as to force to carry out the positioning at three locations of the cutouts 374a. Therefore, it is possible to carry out the positioning of the center of the wafer boat 308 in radial and circumferential directions. Furthermore, in FIGS. 18 and 19, although there is shown a slight gap between the guide member 383 and the cutout 374a for convenience, they are practically brought into tightly contact with each other.

Conventionally, in a case where the wafer boat is transferred to the wafer transfer stage, the load of the wafer boat is dispersed in the wafer boat transfer arm and the loading face, and the wafer boat is made of a material, which is difficult to slide, such as quartz or SiC, so that it is difficult to carry out the positioning. On the other hand, in this preferred embodiment, when the positioning is carried out, the load of the wafer boat 307 is concentrated on the guide members 383 by pushing the guide members 383 up, so that the cutouts 374a of the wafer boat 307 slide on the guide members 383 to engage the guide members 383. Thus, it is possible to accurately carry out the positioning. In addition, since air blowing on the loading face decreases the frictional force between the wafer boat 307 and the loaded plate 373, the wafer boat 307 is easy to slide, so that the positioning can be smoothly carried out.

In such a vertical heat treating apparatus, even if there is a slight shift when the wafer boat 307 is transferred from the wafer transfer stage 363 to the heat insulating cover 362, it is possible to force to carry out the positioning when the wafer boat 307 is transferred from the heat insulating cover 362 to the wafer transfer stage 363 via the intermediate stage 364 after the heat treatment is completed. Thus, since the position shift is corrected every time the processing is carried out, it is possible to prevent the accumulation of position shifts, so that it is possible to prevent the wafer boat from accidentally overturning due to the accumulation of position shifts.

In this preferred embodiment, the positioning may be forcibly carried out at the intermediate stage 364, or at both of the wafer transfer stage 363 and the intermediate 364. Alternatively, for example, the wafer boat 307 may be sucked from the upper side in place of the air supplied to the loading face, to decrease the load of the wafer boat 307 applied to the loading face and the guide member 383 when positioning, so as to decrease the frictional force between the wafer boat 307 and the loading face.

As mentioned above, according to the present invention, it is possible to prevent first and second holders from overturning when the first and second holders are used to carry out the heat treatment of objects to be treated. In addition, according to the present invention, it is possible to easily and quickly carry out the transfer operations of treating substrates to be treated or dummy substrates to be treated, to the first holder, and it is also possible to house a plurality of objects to be treated, in a cassette housing portion.

While the present invention has been disclosed in terms of the preferred embodiments in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A vertical heat treating apparatus comprising:

a vertical heat treating furnace for allowing objects to be treated in and out of the furnace from a bottom thereof;

first and second holders for holding a plurality of objects to be treated, said first and second holders being carried in and out of said vertical heat treating furnace;

a first holder carrying means, on which said first holder is provided, for moving said first holder between an internal position in said vertical heat treating furnace and a transfer region remote from the position in said vertical heat treating furnace, said first holder carrying means including means for vertically moving said first holder between said internal position and an intermediate position vertically away from said vertical heat treating furnace and means for horizontally swinging said first holder between said intermediate position and said transfer region;

a second holder carrying means, on which said second holder is provided, for moving said second holder between an internal position in said vertical heat treating furnace and a transfer region remote from said internal position in said vertical heat treating furnace, said second holder carrying means including means for vertically moving said second holder between said internal position and an intermediate position vertically away from said vertical heat treating furnace and means for horizontally swinging said second holder between said intermediate position and said transfer region;

a third holder, provided in said transfer region, for holding dummy objects to be treated;

an object transfer means, provided in said transfer region, for feeding objects to be treated to said first and second holders moved by said first holder transfer means and said second holder transfer means and for transferring said dummy objects from said third holder to said first or second holder moved by said first holder transfer means and said second holder transfer means;

wherein said swinging means of said first holder carrying means and said swinging means of said second carrying means horizontally swing alternately, so that said first and second holders alternatively move between said vertical heat treating furnace and said transfer region reciprocally, whereby while said objects in said one holder located in said furnace is treated, said objects to be treated and said dummy objects are installed into said other holder in said transfer region so as to proceed with successive loading and heat treating.

2. A vertical heat treating apparatus as set forth in claim 1, further comprising:

a transfer chamber being in communication with said vertical heat treating furnace and receiving therein said first and second holders, said first and second holder carrying means, said object transfer means and said third holder;

a delivery port, formed in a wall of said transfer chamber so as to face said transfer region, for carrying the objects to be treated into said transfer chamber from the outside thereof;

a closed-type treated-object cassette having a cassette body for housing therein a plurality of objects to be treated, and a lid for opening and closing an opening of said cassette body, the interior of said cassette being communicated with the interior of said transfer chamber by arranging said opening, which is closed by said lid of said cassette body, in said delivery port and by removing said lid, so as to allow the carrying of said objects to be treated into said transfer chamber; and an object counter for counting, in said delivery port, the number of objects to be treated, housed in said closed-type treated-object cassette after said lid of said closed-type treated-object cassette is removed, wherein said transfer means transfers the objects to be treated, between said closed-type object cassette mounted in said delivery port and said first and second holders, and also transfers said dummy objects to be treated, from said third holder to said first or second holder on the basis of the counted results of said treated-object counter.

3. A vertical heat treating apparatus as set forth in claim 2, further comprising a cassette housing portion, provided in a region outside of said transfer chamber, for housing therein said object cassette receiving therein the objects which have not been treated, and said object cassette housing therein said objects which have been treated.

4. A vertical heat treating apparatus as set forth in claim 1, further comprising:

a transfer chamber being in communication with said vertical heat treating furnace and receiving therein said first and second holders, said first and second holder carrying means, said object transfer means and said third holder;

an object cassette for housing therein a plurality of treating objects to be treated;

an object counter for counting the number of the objects in said object cassette;

a delivery loading portion, which is provided in said transfer region in said transfer chamber and on which said object cassette is loaded; and a cassette housing portion, provided in a region outside of said transfer chamber, for housing therein said object cassette receiving therein the objects which have not been treated, and said object cassette housing therein the objects which have been treated, wherein said transfer means transfers the objects to be treated, between said object cassette mounted on said delivery loading portion and said first and second holders, said transfer means also transferring the dummy objects from said third holder to said first or second holder on the basis of the counted results of said object counter.

5. A vertical heat treating apparatus comprising:

a vertical heat treating furnace for allowing the carrying in and out of the furnace from a bottom thereof;

a holder for holding a plurality of objects to be treated, said holder being carried in and out of said vertical heat treating furnace;

a holder lifting means for lifting said holder between the interior of said vertical heat treating furnace and a lower position below said vertical heat treating furnace;

a holder loading portion, provided in a transfer region remote from said lower position below said furnace, for loading thereon said holder;

a transfer means for moving said holder between said holder lifting means and said holder loading means;

an object transfer means for delivering the objects to be treated to said holder loaded on said holder loading portion; and a positioning means for forcing into position said holder loaded on said holder loading portion.

6. A vertical heat treating apparatus as set forth in claim 5, wherein said positioning means includes:

an engaging portion provided in a lower end portion of said holder;

a guide member, which is provided on said holder loading portion and which engages said engaging portion; and a pushing portion for pushing said guide member up toward said engaging portion, wherein when said holder is loaded on said holder loading portion, said guide member is pushed up by means of said pushing mechanism to forcibly engage said engaging portion of said holder to position said holder.

7. A vertical heat treating apparatus as set forth in claim 6, further comprising a gas supply means for supplying a gas to a loading face of said holder loading portion.

8. A vertical heat treating apparatus comprising:

a vertical heat treating furnace for allowing objects to be treated to move in and out of the furnace from a bottom thereof;

a holder for holding a plurality of objects to be treated, said holder being carried in and out of said vertical heat treating furnace;

a holder lifting means for lifting said holder between the interior of said vertical heat treating furnace and a lower position below said vertical heat treating furnace;

a holder loading portion, provided in a transfer region remote from said lower position below said furnace, for loading thereon said holder;

a transfer means for moving said holder between said holder lifting means and said holder loading means;

an object transfer means for delivering the objects to be treated to said holder loaded on said holder loading portion; and a centering means for forcibly centering said holder on a central position of said holder loading portion from a shifted position away from said central position.

9. A vertical heat treating apparatus as set forth in claim 8, wherein said centering means includes:

an engaging portion provided in a lower end portion of said holder;

a guide member which is provided on said holder loading portion and which engages said engaging portion; and a pushing portion for pushing said guide member up toward said engaging portion;

wherein when said holder is loaded on said holder loading portion, said guide member is pushed up by means of said pushing portion to forcibly engage said engaging portion of said holder to position said holder.

10. A vertical heat treating apparatus as set forth in claim 9, further comprising a gas supply means for supplying a gas to a loading face of said holder loading portion.

* * * * *